(12) United States Patent
Ota et al.

(10) Patent No.: US 8,410,003 B2
(45) Date of Patent: Apr. 2, 2013

(54) METHOD OF MANUFACTURING SEMICONDUCTOR DEVICE, METHOD OF PROCESSING SUBSTRATE, AND SUBSTRATE PROCESSING APPARATUS

(75) Inventors: Yosuke Ota, Toyama (JP); Yoshiro Hirose, Toyama (JP); Naonari Akae, Toyama (JP); Yushin Takasawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 111 days.

(21) Appl. No.: 13/168,600

(22) Filed: Jun. 24, 2011

(65) Prior Publication Data

US 2011/0318940 A1 Dec. 29, 2011

(30) Foreign Application Priority Data

Jun. 28, 2010 (JP) .................................. 2010-146007
Apr. 19, 2011 (JP) .................................. 2011-092570

(51) Int. Cl.
*H01L 21/31* (2006.01)
(52) U.S. Cl. ....................................... 438/775; 438/791
(58) Field of Classification Search ........... 438/758–794
See application file for complete search history.

(56) References Cited

U.S. PATENT DOCUMENTS

| 4,430,149 | A | * | 2/1984 | Berkman | 438/778 |
| 6,147,013 | A | * | 11/2000 | Sun et al. | 438/791 |
| 6,528,430 | B2 | | 3/2003 | Kwan et al. | |
| 6,972,433 | B2 | * | 12/2005 | Miyasaka | 257/66 |
| 2003/0024477 | A1 | | 2/2003 | Okuda et al. | |
| 2009/0075490 | A1 | * | 3/2009 | Dussarrat | 438/787 |
| 2009/0142491 | A1 | * | 6/2009 | Nakamura et al. | 427/255.7 |

FOREIGN PATENT DOCUMENTS

| JP | 2002343793 A | 11/2002 |
| JP | 200345864 A | 2/2003 |

* cited by examiner

*Primary Examiner* — Fernando L Toledo
*Assistant Examiner* — Bryan Junge
(74) *Attorney, Agent, or Firm* — Volpe and Koenig, P.C.

(57) ABSTRACT

A method of manufacturing a semiconductor device includes forming a layer containing a predetermined element on a substrate by supplying a source gas containing the predetermined element into a process vessel and exhausting the source gas from the process vessel to cause a chemical vapor deposition (CVD) reaction. A nitrogen-containing gas is supplied into the process vessel and then exhausted, changing the layer containing the predetermined element into a nitride layer. This process is repeated to form a nitride film on the substrate. The process vessel is purged by supplying an inert gas into the process vessel and exhausting the inert gas from the process vessel between forming the layer containing the predetermined element and changing the layer containing the predetermined element into the nitride layer.

12 Claims, 11 Drawing Sheets

WHEN FLOW VELOCITY OF HCD IS LOW

WHEN FLOW VELOCITY OF HCD IS HIGH

WHEN FLOW VELOCITY OF HCD IS LOW

WHEN FLOW VELOCITY OF HCD IS HIGH

METHOD OF MANUFACTURING SEMICONDUCTOR DEVICE, METHOD OF PROCESSING SUBSTRATE, AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2010-146007, filed on Jun. 28, 2010, and No. 2011-092570, filed on Apr. 19, 2011, in the Japanese Patent Office, the entire contents of which are hereby incorporated by reference.

BACKGROUND OF THE INVENTION

1. Field of the Invention

The present invention relates to a method of manufacturing a semiconductor device and a method of processing a substrate, the methods including a process of forming a thin film on a substrate, and a substrate processing apparatus suitable for the process.

2. Description of the Related Art

A flash memory includes an electron accumulation region (floating gate) surrounded by an insulating film and operates in a manner such that information is written in the flash memory by electron exchange through a thin tunnel oxide film and the stored information is retained for a long time by holding electrons using the insulating capacity of the thin tunnel oxide film. Information is stored by accumulating electrons or holes into the floating gate through a tunnel insulating film upon writing and erasure in the flash memory. However, as miniaturization is performed, an equivalent oxide thickness (EOT, an oxide film-converted film thickness) of the tunnel insulating film must be decreased. Accordingly, a nitride film ($Si_3N_4$ film, hereinafter, referred to as a SiN film) having a higher permittivity than an oxide film ($SiO_2$ film, hereinafter, referred to as a SiO film) may be used as the tunnel insulating film. However, since the SiN film has a high defect density, a reduction in defect density is needed. Since structural defects such as a dangling bond are easily bonded to hydrogen, a film in which a large number of hydrogen atoms are contained may be referred to as a film having a high defect density. Accordingly, a high quality SiN film with no hydrogen is needed.

In the related art, the SiN film is formed by, for example, a chemical vapor deposition (CVD) method using $SiH_2Cl_2$ gas and $NH_3$ gas at a high temperature of about 700 to 800° C. However, since the SiN film formed by the CVD method (CVD-SiN film) has a high defect density and contains hydrogen of the order of $10^{21}$ as a quantitative value of the hydrogen by thermal desorption spectroscopy (TDS), improvement thereof is needed.

In addition, since it is difficult to reduce hydrogen by a high film-forming temperature due to the restriction of the film thickness uniformity or step coverage characteristics in the CVD method, a film-forming technique in substitution for the CVD method is required.

In an atomic layer deposition (ALD) method, which may be substituted for the CVD method, a raw material includes hydrogen when an ALD-SiN film is formed using, for example, $SiH_2Cl_2$ gas and $NH_3$ gas. Since the hydrogen contained in the raw material remains in the film at a temperature region (about 550° C. or lower) in which the ALD method is performed, a technique to substitute for the ALD-SiN film forming method using $SiH_2Cl_2$ gas and $NH_3$ gas, having good film thickness uniformity or step coverage characteristics is needed.

In addition, the SiN film formed by the CVD method is known to have high stress. When the film is directly formed on a silicon substrate, integrational errors such as defects' diffusion into the substrate, an increase in leakage current or an increase in oxidation rate, occur, and thus, stress of the SiN film must be controlled.

[Patent Document 1] Japanese Unexamined Patent Application Publication No. 2003-45864

When a SiN insulating film is formed, hydrogen (H) included in raw materials used when the film is formed remains as impurities in the film due to a low film-forming temperature. Since the hydrogen remaining in the film has a structure such as Si—H bonding or N—H bonding and is easily broken to be a charge trap structure by acceptation and re-bonding of electrons or holes, a defect density may be increased. According to thermal desorption spectroscopy (TDS), since the hydrogen in the film leaves at a film forming temperature or higher, particularly, 800° C. or higher, the hydrogen in the film can be reduced by a high film forming temperature. However, since uniformity of the film thickness in the SiN insulating film is noticeably deteriorated as the film forming temperature is increased, it is difficult to apply this temperature increasing method to production.

SUMMARY OF THE INVENTION

Therefore, it is an object of the present invention to provide a method of manufacturing a semiconductor device, a method of processing a substrate, and a substrate processing apparatus that are capable of forming an insulating film having a extremely low concentration of hydrogen in a film and good uniformity in film thickness in a high temperature region.

According to an aspect of the present invention, there is provided a method of manufacturing a semiconductor device, including: forming a layer containing a predetermined element on a substrate by supplying a source gas containing the predetermined element into a process vessel accommodating the substrate and exhausting the source gas from the process vessel under a condition where a chemical vapor deposition (CVD) reaction is caused; changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure; forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

According to another aspect of the present invention, there is provided a method of processing a substrate, including: forming a layer containing a predetermined element on a substrate by supplying a source gas containing the predetermined element into a process vessel accommodating the substrate and exhausting the source gas from the process vessel under a condition where a chemical vapor deposition (CVD) reaction is caused; changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure; forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

According to still another aspect of the present invention, there is provided a substrate processing apparatus including: a process vessel configured to accommodate a substrate; a heater configured to heat an inside of the process vessel; a source gas supply system configured to supply a source gas containing a predetermined element into the process vessel; a nitrogen-containing gas supply system configured to supply a nitrogen-containing gas into the process vessel; a gas supply system configured to supply one of an inert gas and a hydrogen-containing gas into the process vessel; an exhaust system configured to exhaust the inside of the process vessel; a pressure regulator configured to control pressure of the inside of the process vessel; and a controller configured to control the heater, the source gas supply system, the nitrogen-containing gas supply system, the gas supply system, the exhaust system, and the pressure regulator so as to perform: a process of forming a layer containing the predetermined element on the substrate by supplying the source gas into the process vessel accommodating the substrate and exhausting the source gas from the process vessel under a condition where a chemical vapor deposition (CVD) reaction is caused; a process of changing the layer containing the predetermined element into a nitride layer by supplying the nitrogen-containing gas into the process vessel and exhausting the nitrogen-containing gas from the process vessel, wherein the inside of the process vessel is heated and a pressure of the inside of the process vessel is lower than an atmospheric pressure; a process of forming a nitride film having a predetermined film thickness on the substrate by alternately repeating the process of forming the layer containing the predetermined element and the process of changing the layer containing the predetermined element into the nitride layer; and a process of purging the inside of the process vessel by supplying the inert gas into the process vessel and exhausting the inert gas from the process vessel between the process of forming the layer containing the predetermined element and the process of changing the layer containing the predetermined element into the nitride layer, wherein, in the process of forming the layer containing the predetermined element, the source gas is supplied toward the substrate through a nozzle disposed at a side of the substrate, and one of the inert gas and the hydrogen-containing gas is supplied together with the source gas through the nozzle toward the substrate, such that a flow velocity of the source gas flowing parallel to a surface of the substrate is greater than that of the inert gas flowing parallel to the surface of the substrate in purging the inside of the process vessel.

According to the present invention, it is possible to provide a method of manufacturing a semiconductor device, a method of processing a substrate, and a substrate processing apparatus that are capable of forming an insulating film having a extremely low concentration of hydrogen in a film and good uniformity in film thickness in a high temperature region.

DETAILED DESCRIPTION OF THE PREFERRED EMBODIMENTS

Figure 1:
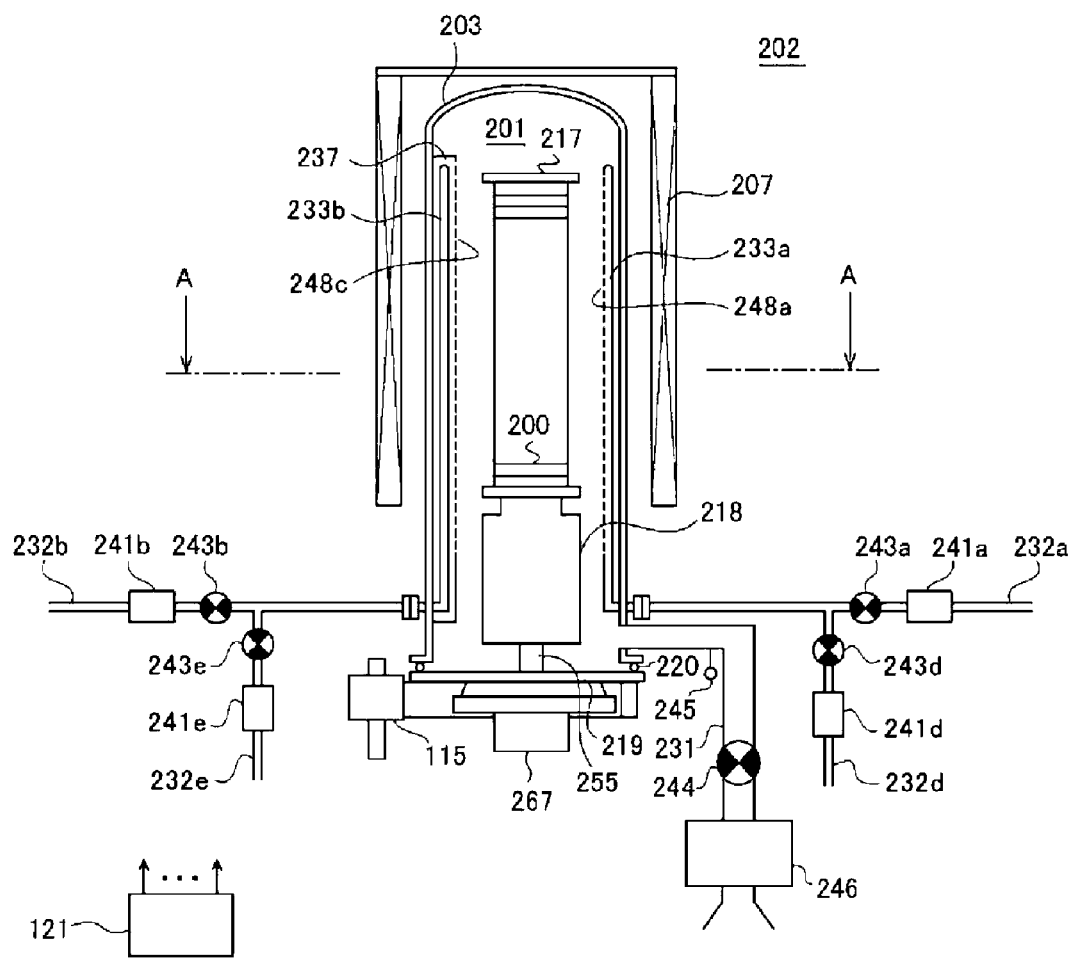
FIG. 1 is a schematic view of a vertical process furnace of a substrate processing apparatus that can be suitably used according to an embodiment of the present invention, that is, a vertical sectional view of the process furnace.

The inventors have studied a method of forming an insulating film in a high temperature region. As a result, it has been found that an insulating film having a substantially low concentration of hydrogen in a film and good uniformity in film thickness can be formed in a high temperature region as follows. A nitride film having a predetermined film thickness is formed on a substrate by performing: a process of forming a layer containing a predetermined element on the substrate by supplying a source gas containing the predetermined element into a process vessel accommodating the substrate and exhausting the source gas from the process vessel under a condition where a chemical vapor deposition (CVD) reaction is caused; a process of changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure; a process of forming the nitride film having the predetermined film thickness on the substrate by alternately repeating the process of forming the layer containing the predetermined element and the process of changing the layer containing the predetermined element into the nitride layer; and a process of purging the inside of the process vessel by supplying an inert gas into the process vessel and exhausting the inert gas from the process vessel between the process of forming the layer containing the predetermined element and the process of changing the layer containing the predetermined element into the nitride layer. In the process of forming the layer containing the predetermined element, the source gas is supplied toward the substrate through a nozzle disposed at a side of the substrate, and one of the inert gas and a hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the process of purging the inside of the process vessel.

The process of forming the layer containing the predetermined element is performed under a condition where a CVD reaction is caused. At this time, a predetermined element layer is formed on the substrate as the layer containing the predetermined element constituted by less than one atomic layer to several atomic layers. The layer containing the predetermined element may be an adsorption layer of the source gas containing the predetermined element (hereinafter simply referred to as a source gas). The predetermined element layer is a general term used to denote a continuous layer made of the predetermined element, a discontinuous layer, and a thin film in which such layers overlap. In addition, a continuous layer made of the predetermined element may also be called a "thin film." Further, the adsorption layer of the source gas may include a continuous chemical adsorption layer formed by molecules of the source gas and a discontinuous chemical adsorption layer formed by molecules of the source gas. Furthermore, the expression "a layer less than one atomic layer" is used to denote a discontinuous atomic layer. In a condition where the source gas decomposes by itself, the predetermined element layer, i.e., a deposition layer of the predetermined element is formed on the substrate by deposition of the predetermined element on the substrate. In a condition where the source gas does not decompose by itself, a source gas adsorption layer is formed on the substrate by adsorption of the source gas on the substrate. The former case where the predetermined element layer is formed on the substrate is more preferable than the latter case where the source gas adsorption layer is formed on the substrate because a film-forming rate of the former case is higher than that of the latter case.

Furthermore, in the process of changing the layer containing the predetermined element into the nitride layer, a nitriding species containing nitrogen is generated by thermally activating or pyrolizing the nitrogen-containing gas in the process vessel which is heated and kept at a pressure lower than atmospheric pressure, and the layer containing the predetermined element is nitrided to be changed (modified) into the nitride layer using the nitriding species. That is, the layer containing the predetermined element is changed into the nitride layer by a reaction between the nitriding species and the layer containing the predetermined element. The process of changing the layer containing the predetermined element into the nitride layer can be performed under a depressurized atmosphere without using plasma. Alternatively, in the process of changing the layer containing the predetermined element into the nitride layer, the nitrogen-containing gas may be activated by plasma.

In the process of forming the layer containing the predetermined element, the source gas is supplied toward the substrate through the nozzle disposed at a side of the substrate, and the inert gas or the hydrogen-containing gas is supplied together with the source gas through the nozzle toward the substrate, so that the flow velocity of the source gas flowing parallel to the surface of the substrate can be greater than the flow velocity of the inert gas flowing parallel to the surface of the substrate in the process of purging the inside of the process vessel. In this way, by increasing the flow velocity of the source gas flowing parallel to the surface of the substrate, the layer containing the predetermined element can be formed on the substrate while inhibiting (suppressing) deposition or adsorption of the layer containing the predetermined element onto the substrate, and the center of the deposition or adsorption of the layer containing the predetermined element can be moved closer to the center of the substrate from an edge side of the substrate. As a result, it can be understood that an insulating film having good thickness uniformity can be formed in a high temperature region.

The present invention is provided based on the knowledge of the inventors. Hereinafter, an embodiment of the present invention will be described with reference to the attached drawings.

Figure 2:
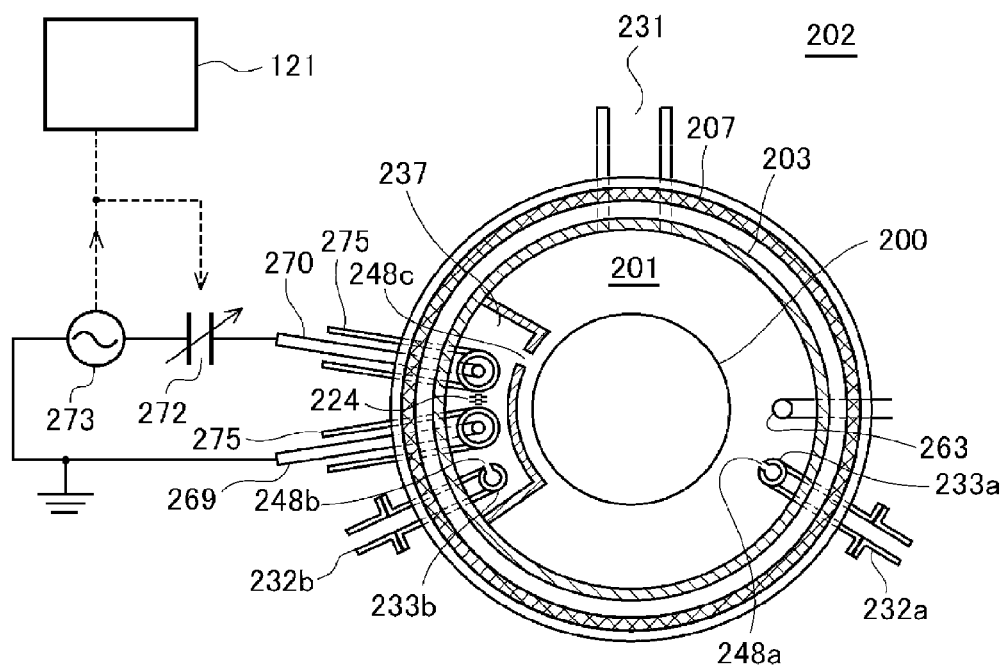
FIG. 2 is a sectional view taken along line A-A of FIG. 1 to schematically illustrate the vertical process furnace according to the embodiment of the present invention.

FIG. 1 is a schematic view of a vertical process furnace 202 of a substrate processing apparatus that can be suitably used according to an embodiment of the present invention, that is, a vertical sectional view of the process furnace 202. FIG. 2 is a sectional view taken along line A-A of FIG. 1 to schematically illustrate the vertical process furnace 202 according to the embodiment of the present invention. However, the present invention is not limited to the substrate processing apparatus of the current embodiment. For example, the present invention may be applied to other substrate processing apparatuses such as a substrate processing apparatus having a single-wafer type, hot wall type, or cold wall type process furnace.

As shown in FIG. 1, the process furnace 202 includes a heater 207 as a heating unit (heating mechanism). The heater 207 has a cylindrical shape and is vertically disposed in a state where the heater 207 is supported on a heater base (not shown) which is a holding plate. As will be described later, the heater 207 is also used as an activation mechanism for activating gas by heat.

Inside the heater 207, a reaction tube 203 constituting a reaction vessel (process vessel) is disposed concentrically with the heater 207. The reaction tube 203 is made of a heat-resistant material such as quartz ($SiO_2$) or silicon carbide (SiC) and has a cylindrical shape with a closed top side and an opened bottom side. The hollow part of the reaction tube 203 forms a process chamber 201 and is configured to accommodate substrates such as wafers 200 using a boat 217

(to be described later) in a manner such that the wafers 200 are horizontally positioned and vertically arranged in multiple stages.

In the process chamber 201, a first nozzle 233a as a first gas introducing part, and a second nozzle 233b as a second gas introducing part are disposed through the lower sidewall of the reaction tube 203. A first gas supply pipe 232a and a second gas supply pipe 232b are connected to the first nozzle 233a and the second nozzle 233b, respectively. In this way, at the reaction tube 203, two nozzles 233a and 233b, and two gas supply pipes 232a and 232b are disposed in such a configuration that a plurality of kinds of gases, here, two kinds of gases, can be supplied into the process chamber 201.

At the first gas supply pipe 232a, a flow rate controller (flow rate control unit) such as a mass flow controller (MFC) 241a, and an on-off valve such as a valve 243a are sequentially disposed from the upstream side of the first gas supply pipe 232a. In addition, a first inert gas supply pipe 232d is connected to the downstream side of the valve 243a of the first gas supply pipe 232a. At the first inert gas supply pipe 232d, a flow rate controller (flow rate control unit) such as an MFC 241d, and an on-off valve such as a valve 243d are sequentially disposed from the upstream side of the first inert gas supply pipe 232d. Further, the first nozzle 233a is connected to the tip of the first gas supply pipe 232a. In an arc-shaped space between an inner wall of the reaction tube 203 and the wafers 200, the first nozzle 233a is erected in a manner such that the first nozzle 233a extends upward from the lower side to the upper side along the inner wall of the reaction tube 203 in a direction in which the wafers 200 are stacked. That is, the first nozzle 233a is disposed at a side of a wafer arrangement region where the wafers 200 are arranged. The first nozzle 233a is an L-shaped long nozzle. Gas supply holes 248a are formed through a lateral surface of the first nozzle 233a. The gas supply holes 248a are formed toward the centerline of the reaction tube 203 so that gas can be supplied toward the wafers 200 through the gas supply holes 248a. The gas supply holes 248a are formed at a plurality of positions from the lower side to the upper side of the reaction tube 203, and the gas supply holes 248a have the same size and are arranged at the same pitch.

A first gas supply system is constituted mainly by the first gas supply pipe 232a, the MFC 241a, and the valve 243a. The first nozzle 233a may be included in the first gas supply system. In addition, a first inert gas supply system is constituted mainly by the first inert gas supply pipe 232d, the MFC 241d, and the valve 243d. The first inert gas supply system also functions as a purge gas supply system.

At the second gas supply pipe 232b, a flow rate controller (flow rate control unit) such as an MFC 241b, and an on-off valve such as a valve 243b are sequentially disposed from the upstream side of the second gas supply pipe 232b. In addition, a second inert gas supply pipe 232e is connected to the downstream side of the valve 243b of the second gas supply pipe 232b. At the second inert gas supply pipe 232e, a flow rate controller (flow rate control unit) such as an MFC 241e, and an on-off valve such as a valve 243e are sequentially disposed from the upstream side of the second inert gas supply pipe 232e. Further, the second nozzle 233b is connected to the tip of the second gas supply pipe 232b. The second nozzle 233b is disposed in a buffer chamber 237, which is a gas diffusion space.

The buffer chamber 237 is disposed in an arc-shaped space between the inner wall of the reaction tube 203 and the wafers 200 in a manner such that the buffer chamber 237 is located from the lower side to the upper side of the inner wall of the reaction tube 203 in the direction in which the wafers 200 are stacked. That is, the buffer chamber 237 is disposed at a side of the wafer arrangement region. At an end of a wall of the buffer chamber 237 adjacent to the wafers 200, gas supply holes 248c are formed to supply gas therethrough. The gas supply holes 248c are formed toward the centerline of the reaction tube 203 so that gas can be supplied toward the wafers 200 through the gas supply holes 248c. The gas supply holes 248c are formed at a plurality of positions from the lower side to the upper side of the reaction tube 203, and the gas supply holes 248c have the same size and are arranged at the same pitch.

The second nozzle 233b is disposed in the buffer chamber 237 at an end opposite to the end where the gas supply holes 248c are formed, in a manner such that the second nozzle 233b is erected upward from the lower side along the upper side of the inner wall of the reaction tube 203 in the direction in which the wafers 200 are stacked. That is, the second nozzle 233b is disposed at a side of the wafer arrangement region. The second nozzle 233b is an L-shaped long nozzle. Gas supply holes 248b are formed through a lateral surface of the second nozzle 233b. The gas supply holes 248b are opened toward the centerline of the buffer chamber 237. Like the gas supply holes 248c of the buffer chamber 237, the gas supply holes 248b are formed at a plurality of positions from the lower side to the upper side of the reaction tube 203. If there is a small pressure difference between the inside of the buffer chamber 237 and the inside of the process chamber 201, it may be configured such that the gas supply holes 248b have the same size and are arranged at the same pitch from the upstream side (lower side) to the downstream side (upper side); however if the pressure difference is large, it may be configured such that the size of the gas supply holes 248b increases or the pitch of the gas supply holes 248b decreases as it goes from the upstream side to the downstream side.

In the current embodiment, since the size or pitch of the gas supply holes 248b of the second nozzle 233b is adjusted from the upstream side to the downstream side as described above, although the velocities of gas streams injected through the gas supply holes 248b are different, the flow rates of the gas streams injected through the gas supply holes 248b can be approximately equal. The gas streams injected through the respective gas supply holes 248b are introduced into the buffer chamber 237 so as to reduce the velocity difference of the gas streams. That is, gas injected into the buffer chamber 237 through the gas supply holes 248b of the second nozzle 233b is reduced in particle velocity and is then injected from the buffer chamber 237 to the inside of the process chamber 201 through the gas supply holes 248c of the buffer chamber 237. Owing to this structure, when gas injected into the buffer chamber 237 through the gas supply holes 248b of the second nozzle 233b is injected into the process chamber 201 through the gas supply holes 248c of the buffer chamber 237, the flow rate and velocity of the gas can be uniform.

A second gas supply system is constituted mainly by the second gas supply pipe 232b, the MFC 241b, and the valve 243b. The second nozzle 233b and the buffer chamber 237 may be included in the second gas supply system. In addition, a second inert gas supply system is constituted mainly by the second inert gas supply pipe 232e, the MFC 241e, and the valve 243e. The second inert gas supply system also functions as a purge gas supply system.

A source gas containing a predetermined element, that is, a source gas containing silicon (Si) as the predetermined element (silicon-containing gas) such as hexachlorodisilane ($Si_2Cl_6$, abbreviation: HCD) is supplied from the first gas supply pipe 232a into the process chamber 201 through the MFC 241a, the valve 243a, and the first nozzle 233a. That is, the first gas supply system is configured as a source gas supply system (silicon-containing gas supply system). At this time, an inert gas is supplied as a deposition/adsorption inhibition gas from the first inert gas supply pipe 232d into the first gas supply pipe 232a through the MFC 241d and the valve 243d. Here, the deposition/adsorption inhibition gas is used to inhibit deposition of silicon or adsorption of HCD gas on surfaces of the wafers 200. The inert gas supplied into the first gas supply pipe 232a as a deposition/adsorption inhibition gas is supplied together with the HCD gas into the process chamber 201 through the first nozzle 233a. At this time, a hydrogen-containing gas may be supplied into the first gas supply pipe 232a as a deposition/adsorption inhibition gas instead of the inert gas. In this case, the first inert gas supply system may be replaced with a hydrogen-containing gas supply system. That is, in this case, a hydrogen-containing gas supply system may be constituted by a hydrogen-containing gas supply pipe 232d, the MFC 241d, and the valve 243d. In this way, the first inert gas supply system may be configured as a deposition/adsorption inhibition gas supply system and replaced with the hydrogen-containing gas supply system.

Gas containing nitrogen (nitrogen-containing gas) such as ammonia ($NH_3$) gas is supplied from the second gas supply pipe 232b into the process chamber 201 through the MFC 241b, the valve 243b, the second nozzle 233b, and the buffer chamber 237. That is, the second gas supply system is configured as a nitrogen-containing gas supply system. At this time, an inert gas may be supplied from the second inert gas supply pipe 232e into the second gas supply pipe 232b through the MFC 241e and the valve 243e.

Inside the buffer chamber 237, as shown in FIG. 2, a first rod-shaped electrode 269 which is a first electrode having a long slender shape, and a second rod-shaped electrode 270 which is a second electrode having a long slender shape are disposed in a manner such that the first and second rod-shaped electrodes 269 and 270 extend from the lower side to the upper side of the reaction tube 203 in the direction in which the wafers 200 are stacked. Each of the first and second rod-shaped electrodes 269 and 270 is installed to be parallel to the second nozzle 233b. The first and second rod-shaped electrodes 269 and 270 are respectively protected by electrode protection pipes 275 which cover the first and second rod-shaped electrodes 269 and 270 from the upper sides to the lower sides thereof. One of the first and second rod-shaped electrodes 269 and 270 is connected to a high-frequency power source 273 through a matching device 272, and the other is grounded to the earth (reference potential). Therefore, plasma can be generated in a plasma generation region 224 between the first and second rod-shaped electrodes 269 and 270. A plasma source, which is a plasma generator (plasma generating unit), is constituted mainly by the first rod-shaped electrode 269, the second rod-shaped electrode 270, the electrode protection pipes 275, the matching device 272, and the high-frequency power source 273. The plasma source is used as an activation mechanism for activating gas using plasma.

The electrode protection pipes 275 are configured such that the first and second rod-shaped electrodes 269 and 270 can be inserted into the buffer chamber 237 in a state where the first and second rod-shaped electrodes 269 and 270 are respectively isolated from the atmosphere of the buffer chamber 237. If the insides of the electrode protection pipes 275 have the same atmosphere as the outside air (atmosphere), the first and second rod-shaped electrodes 269 and 270 that are respectively inserted in the electrode protection pipes 275 are oxidized due to heat emitted from the heater 207. Therefore, an inert gas purge mechanism is disposed to prevent oxidation of the first rod-shaped electrode 269 or the second rod-shaped electrode 270 by filling or purging the insides of the electrode protection pipes 275 with an inert gas such as nitrogen to maintain the oxygen concentration of the insides of the electrode protection pipes 275 at a sufficiently low level.

At the reaction tube 203, an exhaust pipe 231 is disposed to exhaust the inside atmosphere of the process chamber 201. A vacuum pump 246 which is a vacuum exhaust device is connected to the exhaust pipe 231 through a pressure sensor 245 which is a pressure detector (pressure detecting part) configured to detect the inside pressure of the process chamber 201 and an automatic pressure controller (APC) valve 244 which is a pressure regulator (pressure control unit). The APC valve 244 is an on-off valve, which can be opened and closed to start and stop vacuum evacuation of the inside of the process chamber 201 and can be adjusted in degree of valve opening for pressure adjustment. By controlling the degree of opening of the APC valve 244 based on pressure information detected by the pressure sensor 245 while operating the vacuum pump 246, the inside of the process chamber 201 can be vacuum-evacuated to a predetermined pressure (vacuum degree). Mainly, the exhaust pipe 231, the APC valve 244, the vacuum pump 246, and the pressure sensor 245 constitute an exhaust system.

At the lower side of the reaction tube 203, a seal cap 219 is disposed as a furnace port cover capable of hermetically closing the opened bottom side of the reaction tube 203. The seal cap 219 is configured to contact the bottom side of the reaction tube 203 in a perpendicular direction from the lower side. For example, the seal cap 219 is made of a metal such as stainless steel and has a disk shape. On the surface of the seal cap 219, an O-ring 220 is disposed as a seal member configured to contact the bottom side of the reaction tube 203. At a side of the seal cap 219 opposite to the process chamber 201, a rotary mechanism 267 is disposed to rotate a substrate holding tool such as the boat 217 (to be described later). A shaft 255 of the rotary mechanism 267 penetrates the seal cap 219 and is connected to the boat 217. By rotating the boat 217 with the rotary mechanism 267, the wafers 200 can be rotated. The seal cap 219 is configured to be vertically moved by an elevating mechanism such as a boat elevator 115 vertically disposed at the outside of the reaction tube 203. The boat elevator 115 is configured so that the boat 217 can be loaded into and unloaded from the process chamber 201 by raising and lowering the seal cap 219 with the boat elevator 115.

The boat 217, which is a substrate support tool, is made of a heat-resistant material such as quartz or silicon carbide and is configured to support a plurality of wafers 200 in a state where the wafers 200 are horizontally oriented and arranged in multiple stages with the centers of the wafers 200 aligned with each other. At the lower part of the boat 217, an insulating member 218 made of a heat-resistant material such as quartz or silicon carbide is disposed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages.

Inside the reaction tube 203, a temperature sensor 263 is disposed as a temperature detector, and by controlling power supplied to the heater 207 based on temperature information detected by the temperature sensor 263, desired temperature distribution can be attained at the inside of the process chamber 201. Like the first and second nozzles 233a and 233b, the temperature sensor 263 has an L-shape and is disposed along the inner wall of the reaction tube 203.

A controller 121, which is a controller (control unit), is connected to devices such as the MFCs 241a, 241b, 241d and 241e; the valves 243a, 243b, 243d and 243e; the pressure sensor 245; the APC valve 244; the vacuum pump 246; the heater 207; the temperature sensor 263; the boat rotary mechanism 267; the boat elevator 115; the high-frequency power source 273; and the matching device 272. The controller 121 controls, for example, flow rates of various gases using the MFCs 241a, 241b, 241d and 241e; opening/closing operations of the valves 243a, 243b, 243d and 243e; opening/closing operations of the APC valve 244 and pressure adjusting operations of the APC valve 244 based on the pressure sensor 245; the temperature adjusting operation of the heater 207 based on the temperature sensor 263; starting/stopping operations of the vacuum pump 246; the rotation speed adjusting operation of the boat rotary mechanism 267; ascending and descending operations of the boat 217 activated by the boat elevator 115; power supply control of the high-frequency power source 273; and impedance control using the matching device 272.

Next, an explanation of an exemplary method of forming an insulating film such as a nitride film on a substrate using the process furnace of the substrate processing apparatus in one process of processes of manufacturing a semiconductor device will be given. In the following description, the controller 121 controls parts of the substrate processing apparatus.

Figure 3:
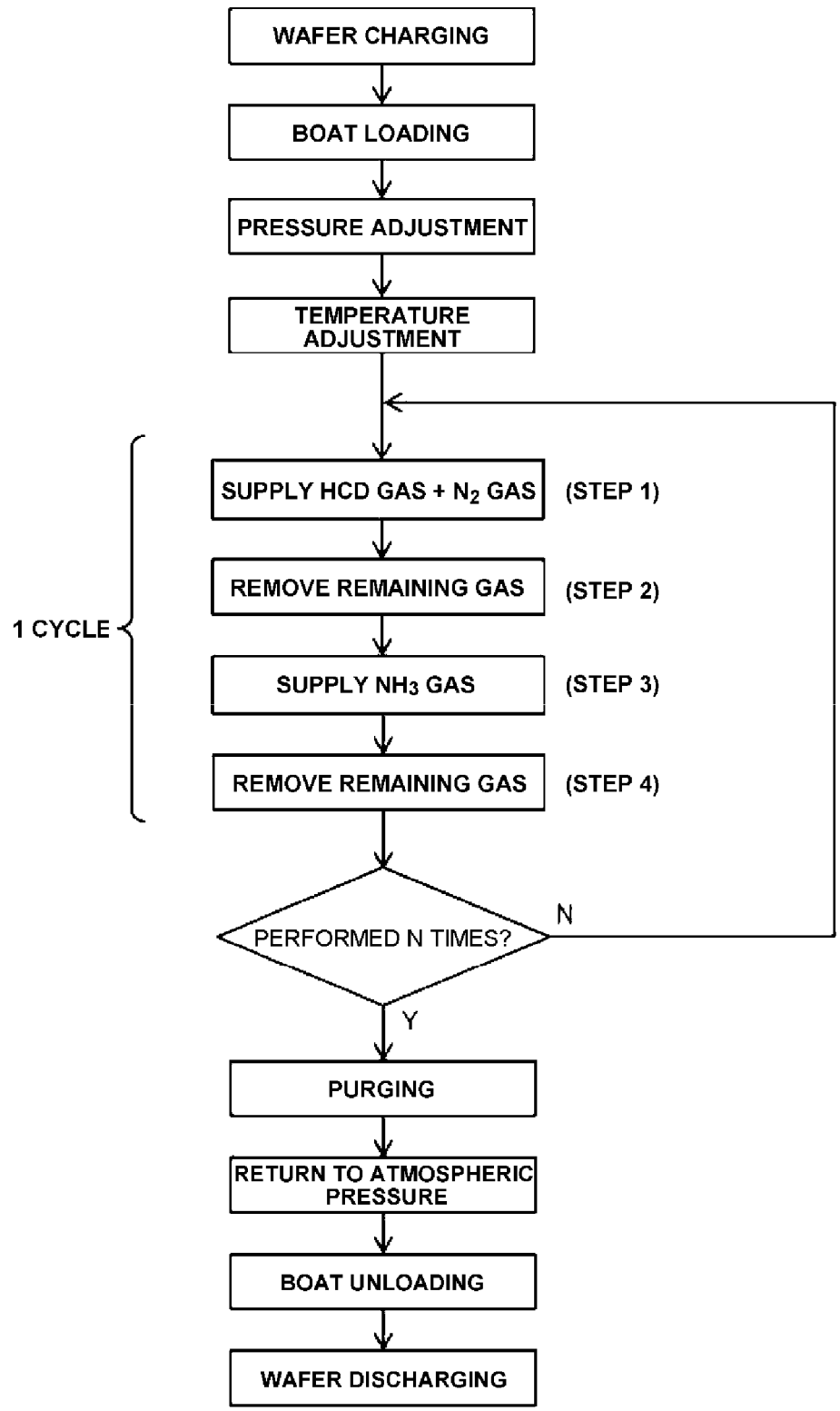
FIG. 3 is a flowchart for explaining film forming flows according to the embodiment of the present invention.
Figure 4:
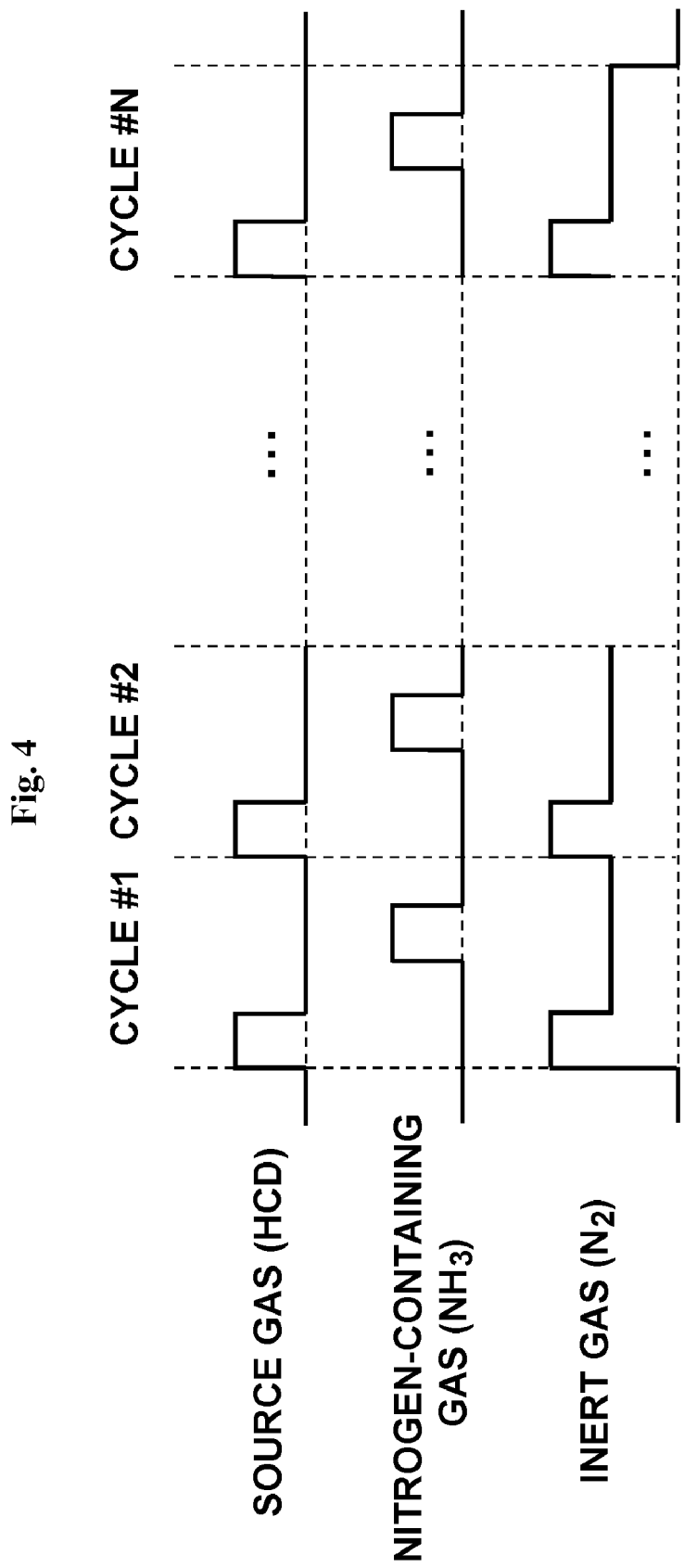
FIG. 4 is a view illustrating gas supply timings of a film-forming sequence for an exemplary case where an inert gas is used as a deposition/adsorption inhibition gas according to the embodiment of the present invention.
Figure 5:
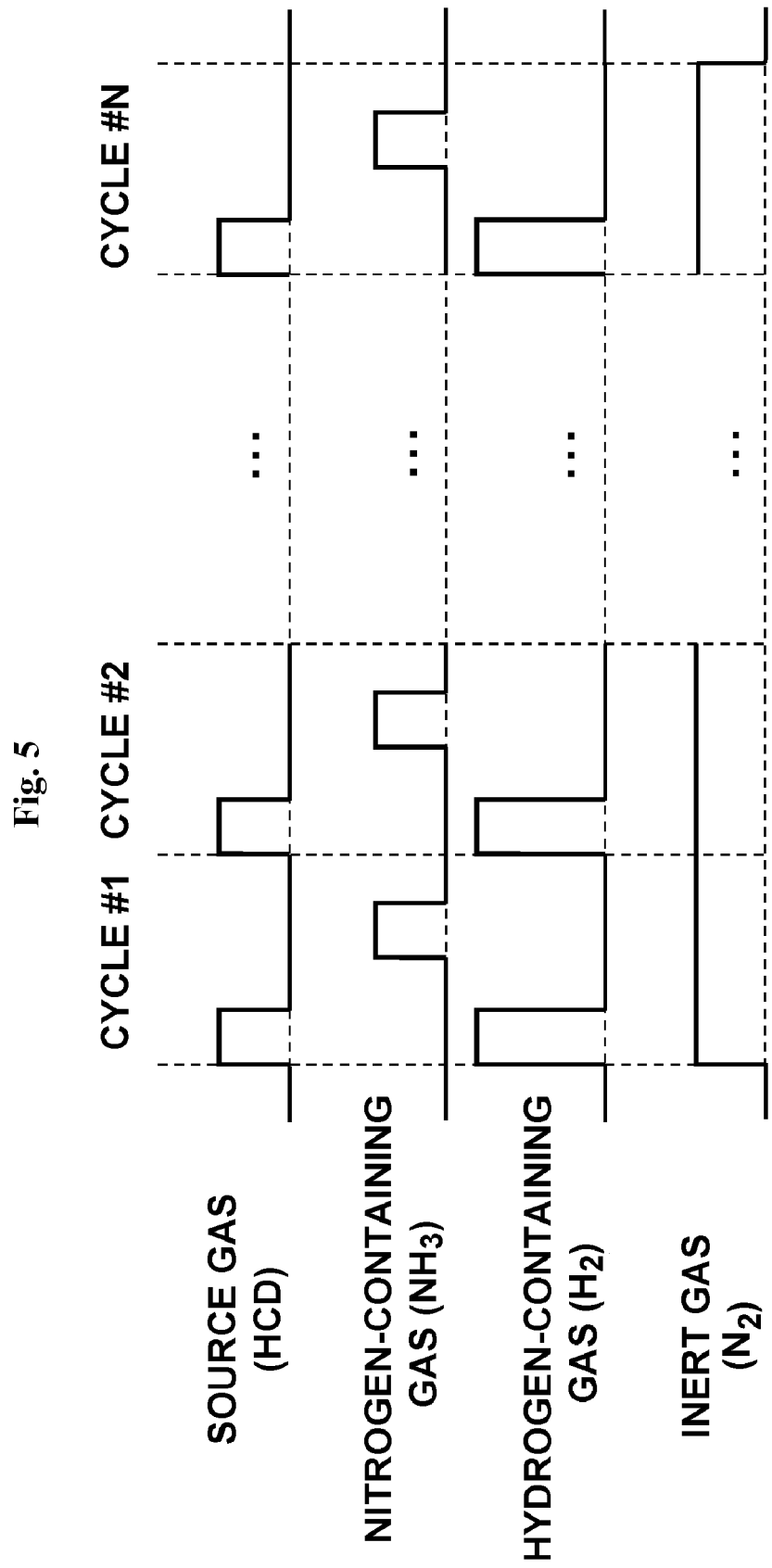
FIG. 5 is a view illustrating gas supply timings of a film-forming sequence for an exemplary case where a hydrogen-containing gas is used as a deposition/adsorption inhibition gas according to the embodiment of the present invention.

FIG. 3 illustrates a film-forming flowchart according to the embodiment of the present invention, and FIGS. 4 and 5 illustrate gas supply timings according to film-forming sequences of the embodiment. In a film-forming sequence of the current embodiment, a nitride film having a predetermined film thickness is formed on a substrate by performing a process of forming a layer containing a predetermined element on the substrate by supplying a source gas containing the predetermined element into the process vessel accommodating the substrate and exhausting the source gas from the process vessel under a condition where a chemical vapor deposition (CVD) reaction is caused; a process of changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure; a process of forming the nitride film having the predetermined film thickness on the substrate by alternately repeating the process of forming the layer containing the predetermined element and the process of changing the layer containing the predetermined element into the nitride layer; and a process of purging the inside of the process vessel by supplying the inert gas into the process vessel and exhausting the inert gas from the process vessel between the process of forming the layer containing the predetermined element and the process of changing the layer containing the predetermined element into the nitride layer. In the process of forming the layer containing the predetermined element, the source gas is supplied toward the substrate through a nozzle disposed at a side of the substrate, and one of the inert gas and a hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the process of purging the inside of the process vessel.

Hereinafter, a detailed explanation will be given. In the following description of the current embodiment, an explanation of an example where silicon nitride films ($Si_3N_4$ films, hereinafter, simply referred to as SiN films) are formed on substrates as insulating films according to the film-forming flows shown in FIG. 3 and the film-forming sequences shown in FIGS. 4 and 5 using HCD gas as a source gas, $NH_3$ gas as a nitrogen-containing gas, $N_2$ gas as a deposition/adsorption inhibition gas, and $N_2$ gas as a purge gas will be given.

After a plurality of wafers 200 are charged into the boat 217 (wafer charging), as shown in FIG. 1, the boat 217 in which the plurality of wafers 200 are supported is lifted and loaded into the process chamber 201 by the boat elevator 115 (boat loading). In this state, the bottom side of the reaction tube 203 is sealed by the seal cap 219 with the O-ring 220 disposed therebetween.

The inside of the process chamber 201 is vacuum-evacuated to a desired pressure (vacuum degree) by the vacuum pump 246. At this time, the pressure in the process chamber 201 is measured by the pressure sensor 245, and based on the measured pressure, the APC valve 244 is feedback-controlled (pressure adjustment). In addition, the inside of the process chamber 201 is heated to a desired temperature using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Then, the following four steps are sequentially performed.

[Step 1]

The valve 243a of the first gas supply pipe 232a and the valve 243d of the first inert gas supply pipe 232d are opened to supply HCD gas through the first gas supply pipe 232a and $N_2$ gas as a deposition/adsorption inhibition gas through the first inert gas supply pipe 232d. The flow rate of the $N_2$ gas flowing through the first inert gas supply pipe 232d is controlled by the MFC 241d. The flow rate of the HCD gas flowing through the first gas supply pipe 232a is controlled by the MFC 241a. The HCD gas and the $N_2$ gas that are adjusted in flow rate are mixed with each other in the first gas supply pipe 232a. Then, the HCD gas and $N_2$ gas are supplied through the gas supply holes 248a of the first nozzle 233a into the process chamber 201 which is heated and depressurized and are exhausted through the gas exhaust pipe 231 (HCD gas+$N_2$ gas supply).

At this time, the APC valve 244 is properly controlled to keep the inside of the process chamber 201 at a pressure lower than atmospheric pressure, for example, in the range of 10 Pa to 1,000 Pa. The supply flow rate of the HCD gas controlled by the MFC 241a is, for example, in the range of 20 sccm to 1,000 sccm (0.02 slm to 1 slm). The supply flow rate of the $N_2$ gas (deposition/adsorption inhibition gas) controlled by the MFC 241d is higher than the supply flow rate of the HCD gas, for example, in the range of 1,000 sccm to 20,000 sccm (1 slm to 20 slm). The wafers 200 are exposed to the HCD gas, for example, for 1 second to 120 seconds. The temperature of the heater 207 is set such that a CVD reaction can be caused in the process chamber 201 in the above-mentioned pressure range. That is, the temperature of the heater 207 is set such that the temperature of the wafers 200 can be kept in the range of 350° C. to 950° C., preferably, in the range of 700° C. to 950° C., more preferably, in the range of 750° C. to 950° C., and most preferably, in the range of 800° C. to 950° C. If the temperature of the wafers 200 is lower than 350° C., decomposition and adsorption of HCD on the wafers 200 are difficult.

In addition, if the temperature of the wafers 200 is higher than 950° C., a CVD reaction occurs excessively, and thus the deposition/adsorption inhibition gas cannot function sufficiently. Thus, it is difficult to prevent deterioration of film thickness uniformity. Meanwhile, if the temperature of the wafers 200 is lower than 700° C., film thickness uniformity is relatively satisfactory. However, if the temperature of the wafers 200 is 700° C. or higher, deterioration of film thickness uniformity is noticeable, and thus the present invention proposing the use of deposition/adsorption inhibition gas is particularly effective. In addition, if the temperature of the wafers 200 is lower than 800° C., especially, lower than 750° C., the hydrogen entered into the film is likely to remain, and a low density film having a large number of hydrogen adsorption sites (defects) is formed. From the above, the temperature of the wafers 200 may be in the range of 350° C. to 950° C., preferably, 700° C. to 950° C., more preferably, 750° C. to 950° C., and most preferably, 800° C. to 950° C. Further, when the temperature of the wafers 200 is in the range of 750° C. to 950° C., preferably, 800° C. to 950° C., operation of the deposition/adsorption inhibition gas can be substantially generated, the hydrogen entered into the film cannot remain easily (can be easily separated), and a high density film having a small number of hydrogen adsorption sites (defects) can be formed. That is, in this temperature range, the film having extremely low concentration of hydrogen in the film and good film thickness uniformity can be formed.

By supplying HCD gas into the process chamber 201 under the above-described conditions, that is, conditions where a CVD reaction occurs, silicon layers (Si layers) can be formed on the wafers 200 (on under-layer films of the wafers 200) as silicon-containing layers each constituted by less than one atomic layer to several atomic layers. The silicon-containing layers may be HCD gas adsorption layers. The silicon layer is a general term used to denote a continuous layer made of silicon, a discontinuous layer made of silicon, and a silicon thin film in which such layers overlap. In addition, the continuous layer made of silicon may also be called a "thin silicon film." Further, the HCD gas adsorption layer may include a continuous chemical adsorption layer formed by chemical adsorption of molecules of HCD gas and a discontinuous chemical adsorption layer formed by chemical adsorption of molecules of HCD gas. Furthermore, the expression "a layer less than one atomic layer" is used to denote a discontinuous atomic layer. In a condition where HCD gas decomposes by itself, a silicon layer is formed on a substrate by deposition of silicon on the substrate. In a condition where HCD gas does not decompose by itself, an adsorption layer of the HCD gas is formed on the substrate by adsorption of the HCD gas on the substrate. If the thickness of a silicon-containing layer formed on the wafer 200 is greater than the thickness of several atomic layers, the silicon-containing layer may not be entirely nitrided in step 3 (to be described later). In addition, the minimum of the silicon-containing layer that can be formed on the wafer 200 is less than one atomic layer. Therefore, it may be preferable for the thickness of the silicon-containing layer to be set to be in the range of about the thickness of less than one atomic layer to about the thickness of several atomic layers. The case where a silicon layer is formed on the wafer 200 is more preferable than the case where an HCD gas adsorption layer is formed on the wafer 200 because the film-forming rate of the former case is higher than that of the latter case.

Figure 10A:
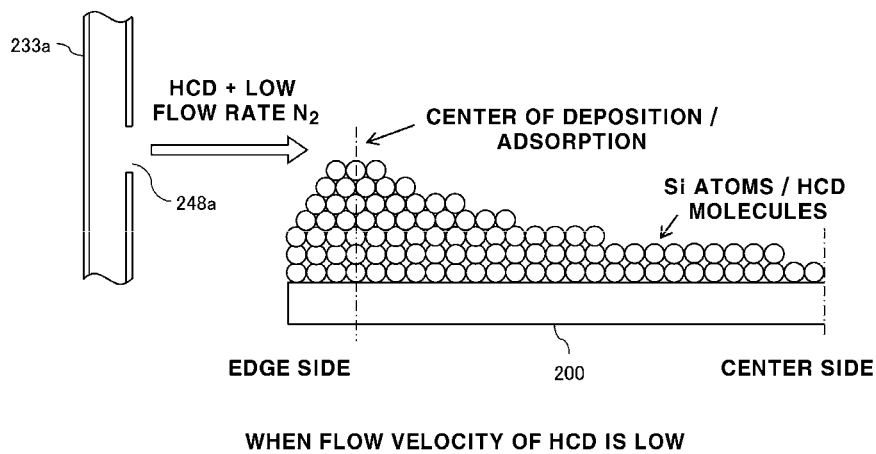
FIG. 10A and FIG. 10B are schematic views illustrating silicon deposition or hexachlorodisilane (HCD) gas adsorption, FIG. 10A illustrating the case where the flow velocity of HCD gas is low, and FIG. 10B illustrating the case where the flow velocity of HCD gas is high.
Figure 10B:
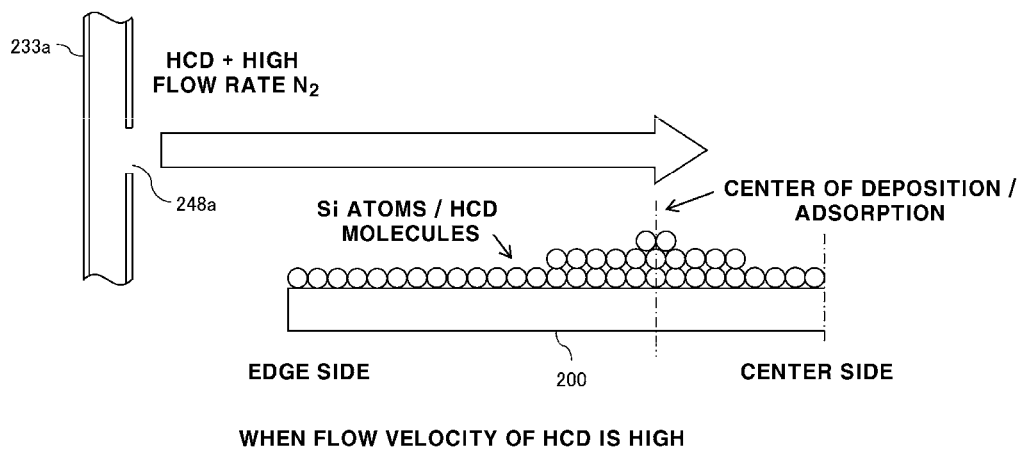

At this time, as described above, $N_2$ gas which is a deposition/adsorption inhibition gas is supplied together with HCD gas at a high flow rate toward the wafers 200 through the same nozzle as the first nozzle 233a through which the HCD gas is supplied, so as to increase the flow velocity of the HCD gas, particularly, the flow velocity of the HCD gas flowing parallel to the surfaces of the wafers 200 (flowing across the surfaces of the wafers 200). That is, HCD gas is injected with high power in a direction parallel to the surfaces of the wafers 200. In this way, deposition efficiency of silicon or adsorption efficiency of HCD gas on the wafers 200 can be reduced to form silicon-containing layers on the wafers 200 while suppressing deposition or adsorption. Owing to the action of the deposition/adsorption inhibition gas, as shown in FIGS. 10A and 10B, a center of the deposition or adsorption of the silicon-containing layer can be moved closer to the center of the wafer 200 from an edge side of the wafer 200. In addition, the thickness difference between the thickest part and the thinnest part of the silicon-containing layer can be reduced. For example, even in a high temperature region of 700° C. or higher where adsorption reaction collapses, that is, in a region where deposition or adsorption of the silicon-containing layer is excessive, the silicon-containing layer can be uniformly formed.

FIG. 10A is a schematic view illustrating silicon deposition or HCD gas adsorption when the flow velocity of HCD gas flowing parallel to the surface of the wafer 200 is low. FIG. 10B is a schematic view illustrating silicon deposition or HCD gas adsorption when the flow velocity of HCD gas flowing parallel to the surface of the wafer 200 is high. In FIGS. 10A and 10B, white arrows denote the flow directions of HCD gas and $N_2$ gas, and white circles (o) on the wafer 200 denote Si atoms deposited on the wafer 200 or HCD gas molecules adsorbed on the wafer 200. In addition, for the sake of convenience, only the left half of the wafer 200 is shown in FIGS. 10A and 10B.

As shown in FIGS. 10A and 10B, by increasing the flow velocity of HCD gas flowing parallel to the surface of the wafer 200, the thickness of the silicon-containing layer can be entirely reduced, and along with this, the center of the deposition or adsorption of the silicon-containing layer can be moved closer to the center of the wafer 200 from an edge side of the wafer 200. In addition, the thickness difference between the thickest part and the thinnest part of the silicon-containing layer can be reduced, and thus the silicon-containing layer can be uniformly formed in the surface of the wafer 200.

Preferably, the supply flow rate of $N_2$ gas which is a deposition/adsorption inhibition gas may be set, as described above, in the range of 1 slm to 20 slm. It is preferable for the supply flow rate of $N_2$ gas to be higher than the supply flow rate of HCD gas. By setting the supply flow rate of $N_2$ gas in this way to keep the volumetric flow rate of $N_2$ gas higher than the volumetric flow rate of HCD gas, the flow velocity of HCD gas flowing parallel to the surface of the wafer 200 can be increased as compared with the case where only HCD gas is supplied. That is, HCD gas is injected with high power in the direction parallel to the surface of the wafer 200 as compared with the case where only HCD gas is supplied. In addition, preferably, the supply flow rate of $N_2$ gas which is a deposition/adsorption inhibition gas may be set to be higher than the supply flow rate of $NH_3$ gas supplied into the process chamber 201 in step 3 (to be described later). By setting the supply flow rate of $N_2$ gas in this way to keep the volumetric flow rate of $N_2$ gas higher than the volumetric flow rate of $NH_3$ gas, the flow velocity of HCD gas flowing parallel to the surface of the wafer 200 can be set to be higher than the flow velocity of $NH_3$ gas flowing parallel to the surface of the wafer 200. That is, HCD gas is injected with a more power than $NH_3$ gas in the direction parallel to the surface of the wafer 200. In addition, preferably, the supply flow rate of $N_2$ gas which is a deposition/adsorption inhibition gas is set to be higher than the supply flow rate of $N_2$ gas which is supplied into the process chamber 201 as a purge gas in step 2 and step 4 (to be described later). By setting the supply flow rate of $N_2$ gas which is a deposition/adsorption inhibition gas in this way to keep the volumetric flow rate of $N_2$ gas higher than the volumetric flow rate of $N_2$ gas which is a purge gas, the flow velocity of HCD gas flowing parallel to the surface of the wafer 200 can be set to be higher than the flow velocity of $N_2$ gas flowing parallel to the surface of the wafer 200 as a purge gas. That is, HCD gas is more strongly injected in the direction parallel to the surface of the wafer 200 than $N_2$ gas (purge gas) being injected in the direction parallel to the surface of the wafer 200.

Specifically, it may be preferable for the volumetric flow rate of $N_2$ gas which is a deposition/adsorption inhibition gas to be about 10 times to 30 times the volumetric flow rate of HCD gas, and about 5 times to 30 times the volumetric flow rate of $N_2$ gas which is a purge gas. By setting the volumetric flow rate of $N_2$ gas which is a deposition/adsorption inhibition gas to be 10 times to 30 times the volumetric flow rate of HCD gas, the flow velocity of HCD gas flowing parallel to the surface of the wafer 200 can be increased more sufficiently. Thus, deposition or adsorption of the silicon-containing layer can be suppressed more sufficiently, and the center of the deposition or adsorption of the silicon-containing layer can be moved closer to the center of the wafer 200 from an edge side of the wafer 200. In addition, the thickness difference between the thickest part and the thinnest part of the silicon-containing layer can be reduced more easily. As a result, film thickness uniformity can be improved more sufficiently. Furthermore, the flow velocity of HCD gas can be prevented from being excessively increased to excessively suppress deposition or adsorption of the silicon-containing layer, thus making it difficult to obtain a practical film-forming rate.

Instead of using HCD as a silicon-containing source, another source may alternatively be used. Examples of such alternative sources include: an inorganic source such as tetrachlorosilane (TCS, $SiCl_4$), dichlorosilane (DCS, $SiH_2Cl_2$), and monosilane ($SiH_4$); and an organic source such as aminosilane-based tetrakisdimethylaminosilane (4DMAS, $Si[N(CH_3)_2]_4$), trisdimethylaminosilane (3DMAS, $Si[N(CH_3)_2]_3H$), bisdiethylaminosilane (2DEAS, $Si[N(C_2H_5)_2]_2H_2$), and bistertiarybutylaminosilane (BTBAS, $SiH_2[NH(C_4H_9)]_2$).

Instead of using $N_2$ gas as a deposition/adsorption inhibition gas, a rare gas such as Ar gas, He gas, Ne gas, and Xe gas may be used as a deposition/adsorption inhibition gas. In addition, a hydrogen-containing gas may be used as a deposition/adsorption inhibition gas. As the hydrogen-containing gas, gases such as hydrogen ($H_2$) gas or deuterium ($D_2$) gas may be used. FIG. 5 is a view illustrating an exemplary film-forming sequence when $H_2$ gas which is a hydrogen-containing gas is used as a deposition/adsorption inhibition gas. The supply flow rate of $H_2$ gas used as a deposition/adsorption inhibition gas is set to be in the range of 1,000 sccm to 20,000 sccm (1 slm to 20 slm) like the supply flow rate of $N_2$ gas used as a deposition/adsorption inhibition gas. In addition, since hydrogen entered into the film cannot remain easily (can be easily separated) under a high temperature of, for example, 750° C. or higher, preferably, 800° C. or higher, even when the hydrogen-containing gas is used as the adsorption inhibition gas, hydrogen concentration reduction effect in the film is not affected. Even in this case, a high density film having a small number of hydrogen adsorption sites (defects) is formed. Further, by supplying $H_2$ gas upon supply of HCD gas, it can be considered that Cl is extracted from the HCD gas, a film-forming rate is improved, and thus, Cl impurities in the film are reduced.

[Step 2]

After the silicon-containing layers are formed on the wafers 200, the valve 243a of the first gas supply pipe 232a is closed to interrupt the supply of HCD gas. At this time, the APC valve 244 of the exhaust pipe 231 is kept open, and the inside of the process chamber 201 is vacuum-evacuated by the vacuum pump 246 so as to remove the remaining HCD gas from the process chamber 201. At this time, in a state where the valve 243d is opened, supply of $N_2$ gas (an inert gas) to the inside of the process chamber 201 is continued. At this time, the valve 243e may be in an open state. The $N_2$ gas functions as a purge gas so that HCD gas remaining in the process chamber 201 without participating in a reaction or after participating in the formation of the silicon-containing layers can be removed more efficiently (remaining gas removal).

At this time, the temperature of the heater 207 is set such that the temperature of the wafers 200 can be in the range of 350° C. to 950° C., preferably, in the range of 700° C. to 950° C., more preferably, in the range of 750° C. to 950° C., and most preferably, in the range of 800° C. to 950° C. as when HCD gas is supplied. The supply flow rate of $N_2$ gas functioning as a purge gas is set to be in the range of 200 sccm to 1,000 sccm (0.2 slm to 1 slm). The volumetric flow rate of $N_2$ gas used as a purge gas need not be higher than the volumetric flow rate of $N_2$ gas used as a deposition/adsorption inhibition gas. That is, although it is lower, a sufficient purge effect can be obtained. Conversely, the volumetric flow rate of $N_2$ gas used as a deposition/adsorption inhibition gas should be higher than the volumetric flow rate of $N_2$ gas used as a purge gas. That is, to obtain the effect of suppressing deposition/adsorption of the silicon-containing layer, it is necessary to set the volumetric flow rate of $N_2$ gas used as a deposition/adsorption inhibition gas to be higher than the volumetric flow rate of $N_2$ gas where only purge effect can be obtained. Thus, when gas remaining in the process chamber 201 is removed by purging, the MFC 241d is controlled to change the supply flow rate of $N_2$ gas through the first inert gas supply pipe 232d from the range of 1 slm to 20 slm to the range of 0.2 slm to 1 slm, and thereby to reduce the volumetric flow rate of $N_2$ gas. Instead of using $N_2$ gas as a purge gas, a rare gas such as Ar gas, He gas, Ne gas, and Xe gas may be used.

[Step 3]

After removing the gas remaining in the process chamber 201, the valve 243b of the second gas supply pipe 232b is opened to allow a flow of $NH_3$ gas through the second gas supply pipe 232b. The flow rate of $NH_3$ gas flowing through the second gas supply pipe 232b is adjusted by the MFC 241b. The $NH_3$ gas adjusted in flow rate is supplied through the gas supply holes 248b of the second nozzle 233b into the buffer chamber 237 which is heated and depressurized. At this time, high frequency power is not applied across the first and second rod-shaped electrodes 269 and 270. Accordingly, $NH_3$ gas supplied into the buffer chamber 237 is activated by heating, supplied from the gas supply holes 248c of the buffer chamber 237 into the process chamber 201 which is heated and depressurized, and exhausted from the exhaust pipe 231 ($NH_3$ gas supply).

At this time, the valve 243e of the second inert gas supply pipe 232e may be opened to supply an inert gas such as $N_2$ gas through the second inert gas supply pipe 232e. The flow rate of the $N_2$ gas is adjusted by the MFC 241e and is supplied into the second gas supply pipe 232b. In this case, a mixture gas of $NH_3$ gas and $N_2$ gas is supplied through the second nozzle 233b. Instead of using $N_2$ gas as an inert gas, a rare gas such as Ar gas, He gas, Ne gas, and Xe gas may be used as the inert gas.

At this time, the APC valve 244 is properly controlled to keep the inside of the process chamber 201 at a pressure lower than atmospheric pressure, for example, in the range of 1 Pa to 3,000 Pa. The flow rate of $NH_3$ gas controlled by the MFC 241b is, for example, in the range of 100 sccm to 10,000 sccm (0.1 slm to 10 slm). The wafers 200 are exposed to $NH_3$ gas, for example, for 1 second to 120 seconds. The temperature of the heater 207 is set such that the temperature of the wafers 200 can be kept, for example, in the range of 350° C. to 1,200° C. It was ascertained that nitriding effect by $NH_3$ gas, that is, nitriding reaction of the silicon-containing layer is obtained under a depressurized atmosphere in the above-described temperature range. In addition, it was also ascertained that nitriding effect could not be improved if the temperature of the wafers 200 was too low. However, in consideration of the throughput, as long as the nitriding reaction of the silicon-containing layer can be obtained, it may be preferable for the wafers 200 to be kept at the same temperature as in step 1 where HCD gas is supplied. That is, it may be preferable for the temperature of the heater 207 to be set to keep the inside of the process chamber 201 in the same temperature in step 1 and step 3. In this case, the temperature of the heater 207 is set such that the temperature of the wafers 200, that is, the inside temperature of the process chamber 201 can be kept at a constant temperature in the range of 350° C. to 950° C., preferably, in the range of 700° C. to 950° C., more preferably, in the range of 750° C. to 950° C., and most preferably, in the range of 800° C. to 950° C. in step 1 and step 3. In addition, it may be preferable for the temperature of the heater 207 to be set such that the inside temperature of the process chamber 201 can be kept at the same temperature in step 1 through step 4 (to be described later). In this case, the temperature of the heater 207 is set such that the inside temperature of the process chamber 201 can be kept at a constant temperature in the range of 350° C. to 950° C., preferably, in the range of 700° C. to 950° C., more preferably, in the range of 750° C. to 950° C., and most preferably, in the range of 800° C. to 950° C. in step 1 through step 4 (to be described later). In addition, by maintaining the temperature in the process chamber 210 at a temperature of 550° C. or higher, nitriding power can be effectively improved by $NH_3$ gas under a depressurized atmosphere. Further, when the nitriding power is to be further improved, it is preferable to keep the inside temperature of the process chamber 201 at 600° C. or higher, more preferably, 700° C. or higher. When $NH_3$ gas is activated by heat and supplied, rather than activated by plasma and supplied, soft reaction can be generated, and nitridation reaction (to be described later) can be softly performed.

By supplying $NH_3$ gas into the process chamber 201 under the above-described conditions, $NH_3$ gas can be thermally activated or pyrolyzed without using plasma under a heated and depressurized atmosphere, so that a nitriding species including nitrogen can be produced. At this time, since HCD gas does not flow in the process chamber 210, $NH_3$ gas does not generate gas phase reaction, and the nitriding species obtained by thermal activation or pyrolysis of $NH_3$ gas reacts at least a part of the silicon-containing layers formed on the wafers 200 in step 1. By the nitridation reaction, the silicon-containing layers can be nitrided, and by the nitridation treatment, the silicon-containing layers can be changed into silicon nitride layers ($Si_3N_4$ layers, hereinafter also referred to simply as SiN layers).

Alternatively, at this time, $NH_3$ gas may be activated by plasma to be flowed. A nitriding species having more energy can be produced by supplying $NH_3$ gas after activating $NH_3$ gas by plasma, and effects such as improvement in device characteristics can be obtained by performing a nitriding treatment using the nitriding species. When $NH_3$ gas is activated by plasma, high-frequency power is applied across the first and second rod-shaped electrodes 269 and 270 from the high-frequency power source 273 through the matching device 272, and then $NH_3$ gas supplied into the buffer chamber 237 is plasma-excited, supplied into the process chamber 201 through the gas supply holes 248c as an activated species, and exhausted through the exhaust pipe 231. At this time, the high-frequency power applied across the first rod-shaped electrode 269 and the second rod-shaped electrode 270 from the high-frequency power source 273 is set to be in the range of, for example, 50 W to 1,000 W. Other processing conditions are set to be the same as those explained in the above description. Furthermore, in the above-described temperature range, $NH_3$ gas can be thermally activated for sufficient reaction necessary to produce a sufficient amount of nitriding species. That is, although $NH_3$ gas is thermally activated without using plasma, sufficient nitriding power can be obtained. When $NH_3$ gas is thermally activated and is supplied, soft reaction can be caused, and thus the above-described nitriding treatment can be softly performed.

As the nitrogen-containing gas, instead of $NH_3$ gas, diazine ($N_2H_2$) gas, hydrazine ($N_2H_4$) gas, $N_3H_8$ gas or an amine-based gas may be used.

[Step 4]

After the silicon-containing layers are changed into silicon nitride layers, the valve 243b of the second gas supply pipe 232b is closed to interrupt the supply of $NH_3$ gas. At this time, the APC valve 244 of the exhaust pipe 231 is kept open, and the inside of the process chamber 201 is vacuum-evacuated by the vacuum pump 246 so as to remove $NH_3$ gas remaining in the process chamber 201. At this time, in a state where the valves 243d and 243e are opened, supply of $N_2$ gas (an inert gas) to the inside of the process chamber 201 is continued. The $N_2$ gas functions as a purge gas so that $NH_3$ gas remaining in the process chamber 201 without participating in a reaction or after participating in the formation of the silicon nitride layers can be removed more efficiently (remaining gas removal).

At this time, the temperature of the heater 207 is set such that the temperature of the wafers 200 can be in the range of 350° C. to 950° C., preferably, in the range of 700° C. to 950° C., more preferably, in the range of 750° C. to 950° C., and most preferably, in the range of 800° C. to 950° C. as when $NH_3$ gas is supplied. The supply flow rate of $N_2$ gas functioning as a purge gas is set to be in the range of 200 sccm to 1,000 sccm (0.2 slm to 1 slm). As described above, the volumetric flow rate of $N_2$ gas used as a purge gas need not be higher than the volumetric flow rate of $N_2$ gas used as a deposition/adsorption inhibition gas. That is, even if it is lower, sufficient purge effect can be obtained. Instead of using $N_2$ gas as a purge gas, a rare gas such as Ar gas, He gas, Ne gas, and Xe gas may be used as a purge gas.

The above-described step 1 to step 4 are set as one cycle, and the cycle is performed at least once, preferably, a plurality of times, so as to form silicon nitride films ($Si_3N_4$ films, hereinafter, simply referred to as SiN films) having a predetermined thickness on the wafers 200.

After the silicon nitride films are formed to a predetermined thickness, the valves 243d and 243e are opened to supply an inert gas such as $N_2$ gas into the process chamber 201 through the first inert gas supply pipe 232d and the second inert gas supply pipe 232e while exhausting the $N_2$ gas through the exhaust pipe 231. The $N_2$ gas functions as a purge gas. Thus, the inside of the process chamber 201 can be purged with the inert gas, and gas remaining in the process chamber 201 can be removed (purging). Then, the inside atmosphere of the process chamber 201 is replaced with the inert gas, and the inside of the process chamber 201 returns to atmospheric pressure (return to atmospheric pressure).

Thereafter, the boat elevator 115 lowers the seal cap 219 to open the bottom side of the reaction tube 203 and unload the boat 217 in which the processed wafers 200 are held to the outside of the reaction tube 203 through the bottom side of the reaction tube 203 (boat unloading). Then, the processed wafers 200 are discharged from the boat 217 (wafer discharging).

In step 1 of the current embodiment, $N_2$ gas functioning as a deposition/adsorption inhibition gas is supplied together with HCD gas at the above-described high flow rate into the process chamber 201 through the first nozzle 233a, so as to increase the flow velocity of the HCD gas, particularly, the flow velocity of the HCD gas ejected through the gas supply holes 248a of the first nozzle 233a toward the wafers 200 in the direction parallel to the surfaces of the wafers 200 (crossing the surfaces of the wafers 200). Thus, deposition efficiency of silicon or adsorption efficiency of HCD gas on the wafers 200 can be reduced to form silicon-containing layers on the wafers 200 while suppressing deposition of silicon or adsorption of HCD gas. Owing to the action of the deposition/adsorption inhibition gas, the center of the deposition or adsorptions of the silicon-containing layers can be moved closer to the centers of the wafers 200 from edge sides of the wafers 200. For example, even in a high temperature region of 700° C. or higher where adsorption reaction collapses, that is, in a region where deposition or adsorption of the silicon-containing layers is excessive, the silicon-containing layers can be uniformly formed.

Furthermore, in step 3 of the current embodiment, using a nitriding species that can be obtained by activating or pyrolizing $NH_3$ gas under a heated and depressurized atmosphere and changing the silicon-containing layers into silicon nitride layers, hydrogen (H) is removed by making an energy of nitriding species break N—H bonds having a bonding energy higher than that of Si—H bonds, as well as the Si—H bonds, and discharged as $H_2$, and the like. Si or N, which is separated from the bonds to hydrogen, is bonded to N or Si, respectively, to form new Si—N bonds. It was ascertained that the SiN film formed by the film-forming sequence of the embodiment has hydrogen concentration in the film, which is smaller than that of the CVD-SiN film by one digit, and becomes a film having extremely good quality.

In addition, it was ascertained that if the silicon nitride film was formed according to the film-forming sequence of the current embodiment, the film thickness uniformity within a wafer could be improved as compared with the case where a silicon nitride film was formed according to a general CVD method. In a general CVD method, inorganic sources such as DCS and $NH_3$ are simultaneously supplied to form a silicon nitride film by CVD. It was ascertained that the impurity concentrations such as hydrogen concentrations of the silicon nitride film formed by the film-forming sequence of the current embodiment were much lower than those of a silicon nitride film formed by a general CVD method. In addition, it was ascertained that the hydrogen concentrations of the silicon nitride film formed by the film-forming sequence of the current embodiment were much lower than those of a silicon nitride film formed by a CVD method using an organic silicon source. Further, according to the film-forming sequence of the current embodiment, although an organic silicon source was used, the film thickness uniformity within a wafer and the hydrogen concentrations in a film were satisfactory.

As described above, according to the film forming sequence of the current embodiment, a silicon nitride film having an extremely low hydrogen concentration (hereinafter referred to as a hydrogen-free SiN film) can be formed, and when the hydrogen-free SiN film is used as a self align contact (SAC), negative bias temperature instability (NBTI) characteristics can be improved.

In addition, when the hydrogen-free SiN film is used as a gate insulating film, insulation breakage resistance can be increased. Si—H bonds have a weak bonding force as compared with Si—N bonds, and are likely to be separated by recombination of hole-electron. Si-dangling bonds, from which hydrogen has separated, become charge traps, contribute to current conduction, and weaken insulating breakage resistance. For this reason, the hydrogen-free SiN film having no hydrogen (especially Si—H bonds) in a film (an extremely small amount of hydrogen) is used as a gate insulating film to obtain high insulating breakage resistance.

Further, according to the film forming sequence of the current embodiment, a silicon nitride film having extremely low stress (hereinafter referred to as a stress-free SiN film) can be formed, and when the stress-free SiN film is used in a shallow trench isolation (STI) process, the following merits can be obtained. That is, while Si-etching is performed using the SiN film as a mask to form the STI, stress of the SiN film is high. In addition, when the SiN film is directly formed on the wafer, since defects enter the wafer (channel part) and cause damage, conventionally, the SiN film is formed after a sacrificial oxide layer is formed on the wafer to about 10 nm. When the stress-free SiN film is used in the STI process, since damage to the wafer (channel part) is not generated even when the stress-free SiN film is directly formed on the wafer, there is no need to form the sacrificial oxide layer, and thus, two processes of forming the sacrificial oxide layer and removing the sacrificial oxide layer can be eliminated. In addition, conventionally, while the SiN film after the masking is in a state in which stress is applied to only a rear surface of the wafer and the wafer is entirely distorted, when the stress-free SiN film is used as a mask, distortion of the wafer after the masking is removed and a portion to be polished is uniformized to enable effective polishing.

Furthermore, in the above-described embodiment, a deposition/adsorption inhibition gas is used to increase the flow velocity of HCD gas flowing parallel to the surfaces of the wafers 200, and thus to suppress deposition of silicon or adsorption of HCD gas on the wafers 200 for improving film thickness uniformity. However, a method of increasing the flow velocity of HCD gas is not limited thereto.

For example, by making the flow resistance of the inside of the reaction tube 203 equal to the flow resistance between the wafers 200, the flow velocity of HCD gas flowing parallel to the surfaces of the wafers 200 can be increased. For example, by filling the upper or lower space of the reaction tube 203 with dummy wafers or insulating plates, the flow velocity of HCD gas flowing parallel to the surfaces of the wafers 200 can be increased to suppress deposition of silicon or adsorption of HCD gas on the wafers 200 and improve film thickness uniformity.

In addition, for example, the conductance between the wafers 200 and the first nozzle 233a through which HCD gas is supplied may be made to be equal to the conductance between the wafers 200 to increase the flow velocity of HCD gas flowing parallel to the surfaces of the wafers 200. For example, by increasing the diameter of the first nozzle 233a or decreasing the diameter of the reaction tube 203, the flow velocity of HCD gas flowing parallel to the surfaces of the wafers 200 can be increased to suppress deposition of silicon or adsorption of HCD gas on the wafers 200 and improve film thickness uniformity.

In addition, for example, by performing supply and exhaustion of HCD gas, the flow velocity of HCD gas flowing parallel to the surfaces of the wafers 200 can be increased. For example, by increasing the pressure difference between the wafer arrangement region in the reaction tube 203 and the inside of the nozzle 233a (the inside of the buffer chamber 237), the flow velocity of HCD gas flowing parallel to the surfaces of the wafers 200 can be increased to suppress deposition of silicon or adsorption of the HCD gas on the wafers 200 and improve film thickness uniformity.

Furthermore, in the above-described embodiment, step 1, step 2, step 3, and step 4 are sequentially performed. Step 1, step 2, step 3, and step 4 are set as one cycle, and the cycle is performed at least once, preferably, a plurality of times, to form silicon nitride films having a predetermined thickness on the wafers 200. Unlike this, the order of step 1 and step 3 may be changed. That is, step 3, step 2, step 1, and step 4 may be sequentially performed. Step 3, step 2, step 1, and step 4 may be set as one cycle, and the cycle may be performed at least once, preferably, a plurality of times, so as to form silicon nitride films having a predetermined thickness on the wafers 200.

Furthermore, in the above-described embodiment, silicon nitride films (SiN films) containing silicon (Si) which is a semiconductor element are formed on substrates as nitride films. However, the present invention may be applied to other cases where metal nitride films containing a metal element such as titanium (Ti), tantalum (Ta) or aluminum (Al) are formed on substrates as nitride films. In this case, formation of layers containing a metal element on substrates by supplying a source gas and a deposition/adsorption inhibition gas (step 1); removal of remaining gas by purging (step 2); changing the layers containing a metal element into metal nitride layers by supplying a nitrogen-containing gas (step 3); and removal of remaining gas by purging (step 4) are set as one cycle, and the cycle is performed at least once, preferably, a plurality of times, to form metal nitride films having a predetermined thickness on the substrates.

For example, titanium nitride films (TiN films) may be formed on substrates as metal nitride films containing titanium (Ti) in the following manner. Formation of titanium-containing layers on the substrates by supplying a source gas and a deposition/adsorption inhibition gas (step 1); removal of remaining gas by purging (step 2); changing the titanium-containing layers into titanium nitride layers by supplying a nitrogen-containing gas (step 3); and removal of remaining gas by purging (step 4) are set as one cycle, and the cycle is performed at least once, preferably, a plurality of times, to form titanium nitride films having a predetermined thickness on the substrates. For example, titanium tetrachloride ($TiCl_4$) gas or tetrakis(dimethylamino)titanium (TIMAT: $Ti[N(C_2H_5)(CH_3)]_4$) gas may be used as the source gas. Like in the above-described embodiment, $NH_3$ gas may be used as the nitrogen-containing gas. In this case, the first gas supply system (source gas supply system) of the substrate processing apparatus of the above-described embodiment may be configured as a titanium-containing gas supply system. In addition, processing conditions may be selected within the processing condition ranges described in the above embodiments. Further, the TiN film is a conductive metal nitride film.

In addition, for example, tantalum nitride films (TaN films) may be formed on substrates as metal nitride films containing tantalum (Ta) in the following manner. Formation of tantalum-containing layers on the substrates by supplying a source gas and a deposition/adsorption inhibition gas (step 1); removal of remaining gas by purging (step 2); changing the tantalum-containing layers into tantalum nitride layers by supplying a nitrogen-containing gas (step 3); and removal of remaining gas by purging (step 4) are set as one cycle, and the cycle is performed at least once, preferably, a plurality of times, to form tantalum nitride films having a predetermined thickness on the substrates. Examples of the source gas include penta ethoxy tantalum (PET, $Ta(OC_2H_5)_5$) gas or tantalum pentachloride ($TaCl_5$) gas. Like in the above-described embodiment, $NH_3$ gas may be used as the nitrogen-containing gas. In this case, the first gas supply system (source gas supply system) of the substrate processing apparatus of the above-described embodiment may be configured as a tantalum-containing gas supply system. In addition, processing conditions may be selected within the processing condition ranges described in the above embodiments. Further, the TaN film is a conductive metal nitride film.

In addition, for example, aluminum nitride films (AlN films) may be formed on substrates as metal nitride films containing aluminum (Al) in the following manner. Formation of aluminum-containing layers on the substrates by supplying a source gas and a deposition/adsorption inhibition gas (step 1); removal of remaining gas by purging (step 2); changing the aluminum-containing layers into aluminum nitride layers by supplying a nitrogen-containing gas (step 3); and removal of remaining gas by purging (step 4) are set as one cycle, and the cycle is performed at least once, preferably, a plurality of times, to form aluminum nitride films having a predetermined thickness on the substrates. For example, tri-methyl-aluminum (TMA: $Al(CH_3)_3$) may be used as the source gas. Like in the above-described embodiment, $NH_3$ gas may be used as the nitrogen-containing gas. In this case, the first gas supply system (source gas supply system) of the substrate processing apparatus of the above-described embodiment may be configured as an aluminum-containing gas supply system. In addition, processing conditions may be selected within the processing condition ranges described in the above embodiments. Further, the MN film is an insulating metal nitride film.

As described above, the film-forming sequence of the current embodiment can also be applied to a process of forming a conductive metal nitride film such as a TiN film or TaN film, or a process of forming an insulating metal nitride film such as an MN film. That is, the film-forming sequence of the current embodiment can be applied when a predetermined element is a metal element as well as when the predetermined element is a semiconductor element. As described above, even when the present invention is applied to formation of a metal nitride film, the same effect as when the present invention is applied to formation of the silicon nitride film can be obtained.

EXAMPLES

First Example

Next, a first example will be described.

SiN films were formed on wafers according to the film-forming sequence of the current embodiment, and film thicknesses and thickness uniformities in surfaces of the wafers were measured. The film-forming temperature (wafer temperature) was set to 800° C. to 950° C., which is known as the thickness at which uniformities are noticeably deteriorated. The supply flow rate of $N_2$ gas which is a deposition/adsorption inhibition gas was changed into three kinds of flow rates between 2 and 8 slm. The three kinds of supply flow rates of $N_2$ gas became (A) 2.5, (B) 5.0 and (C) 7.5 when a certain flow rate was set as 1, which are hereinafter referred to as flow rate conditions (A), flow rate conditions (B) and flow rate conditions (C). The other film forming conditions (processing conditions in each step) were in the processing condition range described in the above embodiment. The results are shown in FIGS. 6 and 7.

Figure 6:
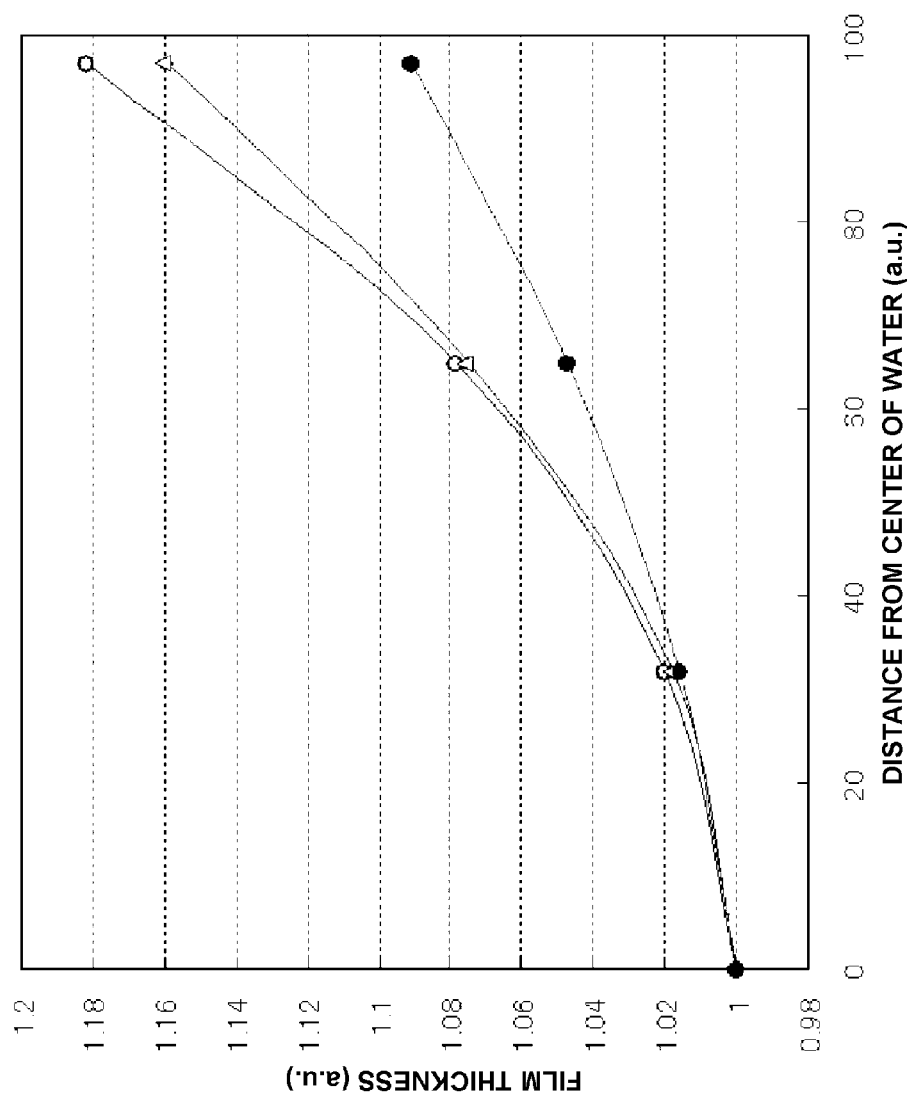
FIG. 6 is a view illustrating the dependence of the thickness of a SiN film on the distance from the center of a wafer for different flow rates of a deposition/adsorption inhibition gas ($N_2$) of a first example.

FIG. 6 is a view illustrating the dependence of the thickness of a SiN film on the distance from the center of a wafer for different flow rates of a deposition/adsorption inhibition gas ($N_2$). The horizontal axis of FIG. 6 denotes the distance (arbitrary unit (a.u.)) from the center of the wafer in the surface of the wafer, i.e., a position directed from the center of the wafer in a wafer edge direction (radial direction). 0 of the horizontal axis of FIG. 6 denotes a center position of the wafer, and 100 denotes a wafer edge position. The vertical axis of FIG. 6 denotes a film thickness (a.u.) of the SiN film. In addition, the film thickness is represented by a ratio of the film thickness when the center thickness of the wafer is set as 1. White circles (○), white triangles (Δ) and black dots (─│─) of FIG. 6 denote film thicknesses when flow rats of the deposition/adsorption inhibition gas ($N_2$) are the flow rate conditions (A), the flow rate conditions (B) and the flow rate conditions (C), respectively.

It will be appreciated from FIG. 6 that, as the supply flow rate of $N_2$ gas which is a deposition/adsorption inhibition gas is increased, the film thickness is reduced at the wafer edge and a thick portion of the film thickness moves toward the center of the wafer. In addition, it will be appreciated that the film thickness difference between the thickest part and the thinnest part of the SiN film can be reduced. That is, it will be appreciated that, as the supply flow rate of $N_2$ gas is increased, a deposition center of silicon and an adsorption center of HCD gas can be moved from the edge of the wafer toward the center of the wafer and the silicon-containing layer can be uniformly formed, and thus, SiN films can be uniformly formed.

Figure 7:
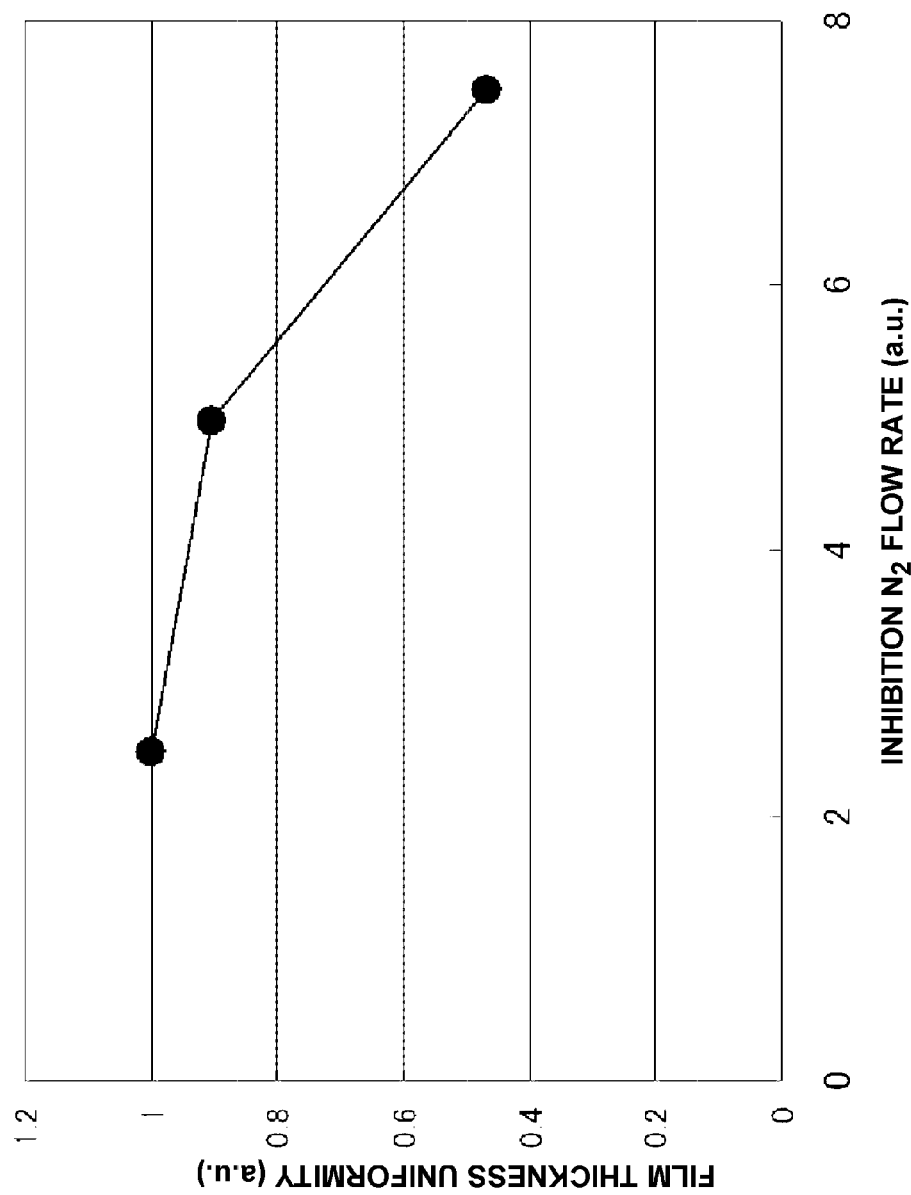
FIG. 7 is a view illustrating the dependence of within-wafer film thickness uniformity of a SiN film on the supply flow rate of a deposition/adsorption inhibition gas ($N_2$) of the first example.

FIG. 7 is a view illustrating the dependence of within-wafer thickness uniformity of a SiN film on the supply flow rate of a deposition/adsorption inhibition gas ($N_2$). The horizontal axis of FIG. 7 denotes the supply flow rate (arbitrary unit (a.u.)) of the deposition/adsorption inhibition gas ($N_2$). In addition, the supply flow rate of $N_2$ gas is represented by a ratio of the supply flow rate when a certain flow rate is set as 1. The vertical axis of FIG. 7 denotes within-wafer thickness uniformity (a.u.) of the wafer. In addition, the within-wafer thickness uniformity is represented by a ratio of the within-wafer thickness uniformity when the within-wafer thickness uniformity under the flow rate conditions (A) of the supply flow rate of the deposition/adsorption inhibition gas ($N_2$) is represented as 1. Black dots (●) of FIG. 7 denote the within-wafer thickness uniformity of SiN film when flow rates of the deposition/adsorption inhibition gas ($N_2$) are the flow rate conditions (A), the flow rate conditions (B) and the flow rate conditions (C) in the sequence from the left side. In addition, the within-wafer thickness uniformity shows a level of dispersion in the within-wafer thickness uniformity. As the level is low, the within-wafer thickness uniformity is represented as good.

It will be appreciated from FIG. 7 that, as the supply flow rate of $N_2$ gas which is a deposition/adsorption inhibition gas is increased; the within-wafer thickness uniformity of SiN films is improved. In addition, it was ascertained that, even when the supply flow rate of the deposition/adsorption inhibition gas ($N_2$) is any one of the flow rate conditions (A), the flow rate conditions (B) and the flow rate conditions (C), the within-wafer thickness uniformity of SiN films became about 10% or lower, in the case of the flow rate conditions (C), the within-wafer thickness uniformity of SiN films became about 5% or lower, and in the case of a high temperature region of 800° C. to 950° C., at which film thickness uniformity is known to noticeably deteriorate, SiN films having extremely good within-wafer thickness uniformity could be formed.

Second Example

Next, a second example will be described.

SiN films were formed on wafers according to the film-forming sequence of the embodiment, and hydrogen concentration and film density of the SiN films were measured. The film-forming temperature (wafer temperature) was changed into three kinds of temperatures in the range of 600° C. to 900° C. The supply flow rate of $N_2$ gas which is a deposition/adsorption inhibition gas was set to a flow rate within the range of 2 slm to 8 slm. Other film forming conditions (processing conditions at each step) were set to conditions in the processing conditions described in the above embodiment. In addition, the hydrogen concentration of SiN films was measured by thermal desorption spectroscopy (TDS), and the film density was measured by X-ray reflection (XRR). The results are shown in FIGS. 8 and 9.

Figure 8:
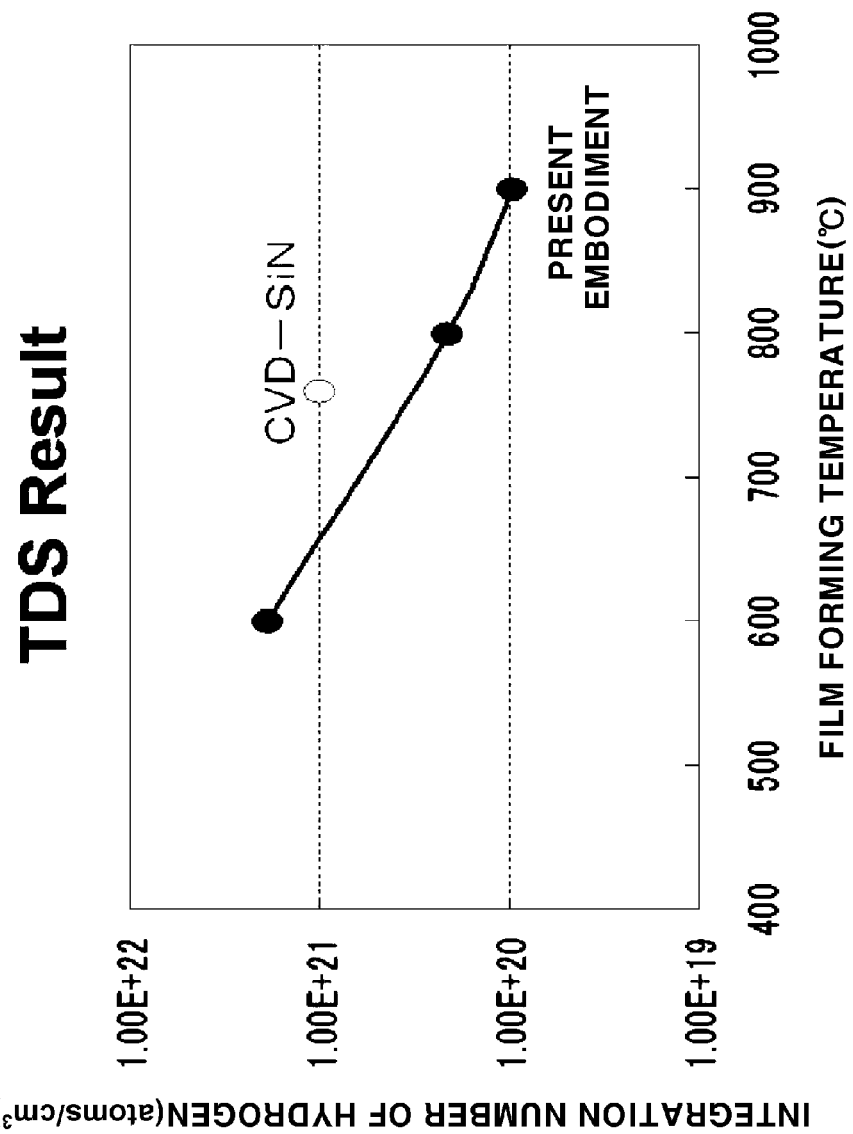
FIG. 8 is a view illustrating a relationship between a film forming temperature of a SiN film and a hydrogen concentration in the SiN film of a second example.

FIG. 8 is a view illustrating a relationship between a film forming temperature of the SiN film and a hydrogen concentration (an amount of hydrogen separated by TDS) in the SiN film of the embodiment. In FIG. 8, the horizontal axis denotes a film forming temperature (wafer temperature, ° C.), and the vertical axis denotes the hydrogen concentration (integration number of hydrogen, atoms/cm$^3$) in SiN films. In FIG. 8, black dots (●) denote hydrogen concentrations in SiN films when the film forming temperatures are set to 600° C., 800° C. and 900° C., respectively. Further, in FIG. 8, white circles (○) denote hydrogen concentrations of SiN films formed by conventional CVD (CVD-SiN films) using $SiH_2Cl_2$ gas and $NH_3$ gas at a temperature range of 700° C. to 800° C. as comparative examples.

It will be appreciated from FIG. 8 that the hydrogen concentration in the SiN films is reduced as the film forming temperature is increased, and in the temperature range of 700° C. to 800° C. or higher, is lower than the hydrogen concentration in the CVD-SiN films of the comparative examples. In addition, it will be appreciated that, in comparison with the comparative example in which the hydrogen concentration of the CVD-SiN films is $10^{21}$ order ($1.0 \times 10^{21}$ atoms/cm3), the hydrogen concentration of the SiN films of the embodiment is $10^{20}$ order ($1.0 \times 10^{20}$ atoms/cm$^3$ at 900° C.), which is lower than the hydrogen concentration of the CVD-SiN films of the comparative example by one digit.

Figure 9:
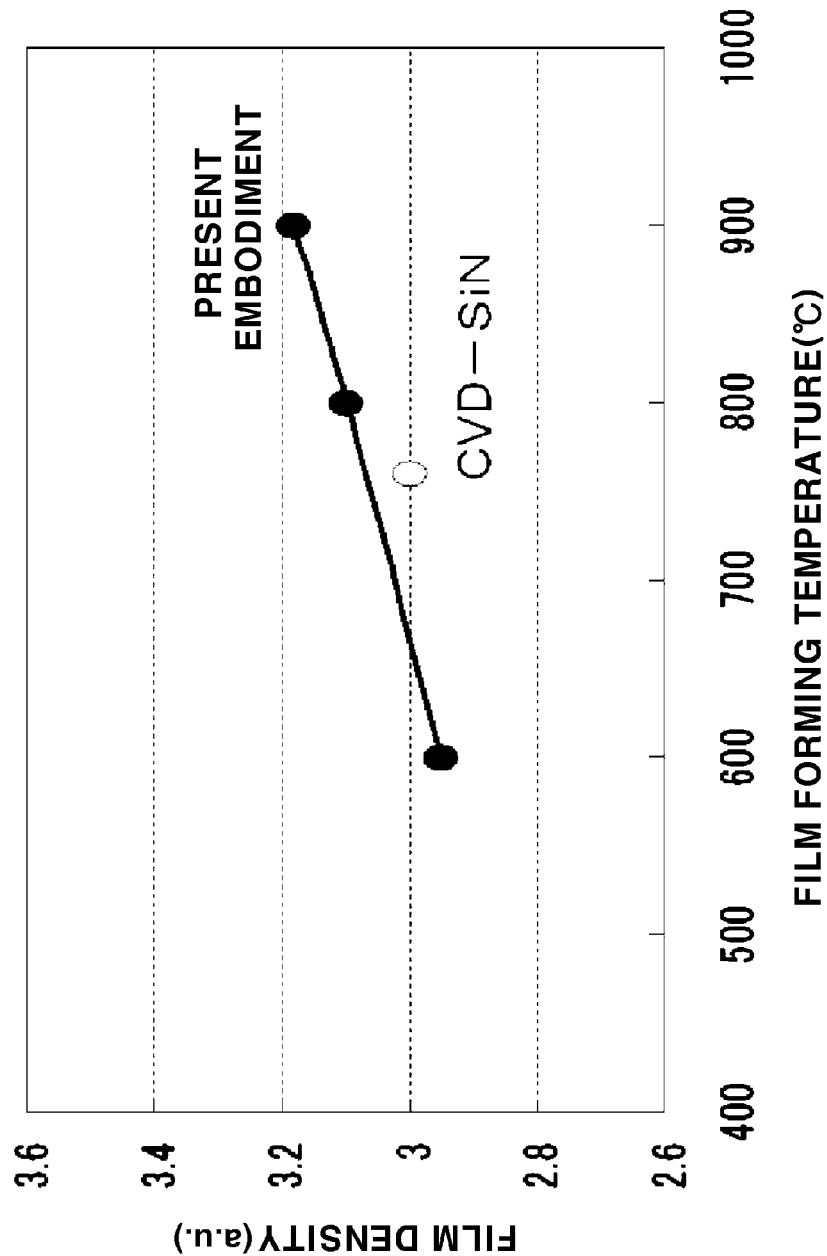
FIG. 9 is a view illustrating a relationship between the film forming temperature of the SiN film and a film density of the SiN film.

FIG. 9 is a view illustrating a relationship between a film forming temperature of the SiN film and a film density of the SiN film of the embodiment. In FIG. 9, the horizontal axis denotes the film forming temperature (wafer temperature, ° C.), and the vertical axis denotes the film density (a.u.) of the SiN films. In FIG. 9, black dots (●) denote film densities of the SiN films when the film forming temperatures are set to 600° C., 800° C. and 900° C., respectively. In addition, in FIG. 9, white circles (○) denote the film density of SiN films formed by conventional CVD (CVD-SiN films) using $SiH_2Cl_2$ gas and $NH_3$ gas at a temperature range of 700° C. to 800° C. as comparative examples.

It will be appreciated from FIG. 9 that the film density of SiN films of the embodiment is increased as the film forming temperature is increased, and in a temperature range of 700°

C. to 800° C., is higher than the film density of the CVD-SiN films of the comparative example.

Third Example

Next, a third example will be described.

SiN films were formed on wafers using a film-forming sequence of the embodiment where a deposition/adsorption inhibition gas was used and a film forming sequence of the embodiment where the deposition/adsorption inhibition gas was not used, and within-wafer thickness uniformities of the SiN films were respectively measured. The film forming temperatures in the film forming sequence of the embodiment where the deposition/adsorption inhibition gas was used were changed between 800° C. and 900° C. The film forming temperatures in the film forming sequence of the embodiment where the deposition/adsorption inhibition gas was not used were changed between 600° C. and 900° C. Other film forming conditions (processing conditions in each step) were set in the conditions described in the embodiment.

Figure 11:
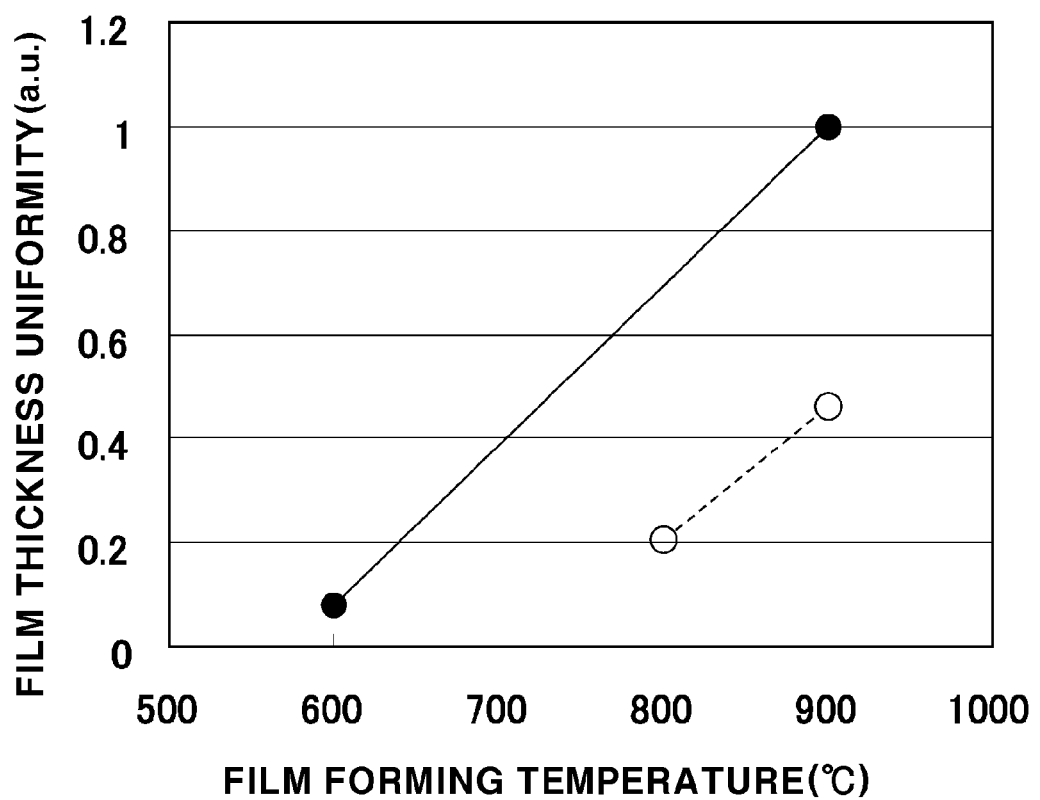
FIG. 11 is a view illustrating a relationship between a film forming temperature of a SiN film and within-wafer film thickness uniformity of a third example.

The results are shown in FIG. 11. FIG. 11 illustrates a relationship between the within-wafer thickness uniformity and the film-forming temperature (wafer temperature). In FIG. 11, the horizontal axis denotes the film-forming temperature (° C.), and the vertical axis denotes the within-wafer thickness uniformity (a.u.). In addition, the within-wafer thickness uniformity is represented by a ratio of the within-wafer thickness uniformity when the within-wafer thickness uniformity of SiN films formed at a film forming temperature of 900° C. through the film forming sequence where the deposition/adsorption inhibition gas was not used is set as 1. In FIG. 11, black dots (●) denote the within-wafer thickness uniformity of the SiN films formed by the film forming sequence of the embodiment when the deposition/adsorption inhibition gas is not used. In addition, white circles (○) denote the within-wafer thickness uniformity of the SiN films formed by the film forming sequence of the embodiment when the deposition/adsorption inhibition gas was used. Further, the within-wafer thickness uniformity denotes a level of dispersion of film thickness distribution in surfaces of wafers, and as the level is lowered, the within-wafer thickness uniformity becomes better.

It will be appreciated from FIG. 11 that the within-wafer thickness uniformity of the SiN films formed by the film forming sequence of the embodiment when the deposition/adsorption inhibition gas was used is better than the within-wafer thickness uniformity of the SiN films formed by the film forming sequence of the embodiment when the deposition/adsorption inhibition gas was not used. In particular, when the film forming temperature is 800° C. to 900° C., the within-wafer thickness uniformity of the SiN films formed by the film forming sequence of the embodiment is ½ or less than the within-wafer thickness uniformity of the SiN films formed by the film forming sequence of the embodiment when the deposition/adsorption inhibition gas was not used. That is, it will be appreciated that, by forming the SiN films using the deposition/adsorption inhibition gas through the film forming sequence of the embodiment, the within-wafer thickness uniformity in the high temperature region can be remarkably improved.

The present invention also includes the following preferred embodiments.

According to an aspect of the present invention, there is provided a method of manufacturing a semiconductor device, including:

forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;

changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

Preferably, in forming the layer containing the predetermined element, a flow rate of one of the inert gas and the hydrogen-containing gas supplied together with the source gas through the nozzle is greater than that of the inert gas supplied through the nozzle in purging the inside of the process vessel.

Preferably, in forming the layer containing the predetermined element, a flow rate of one of the inert gas and the hydrogen-containing gas supplied together with the source gas through the nozzle is greater than that of the source gas.

Preferably, in forming the layer containing the predetermined element, a flow rate of one of the inert gas and the hydrogen-containing gas supplied together with the source gas through the nozzle is ten to thirty times greater than that of the source gas.

Preferably, the flow rate is a volumetric flow rate

Preferably, in forming the layer containing the predetermined element, the layer containing the predetermined element is formed while suppressing at least one of a deposition and an adsorption of the layer containing the predetermined element by an action of one of the inert gas and the hydrogen-containing gas supplied together with the source gas through the nozzle.

Preferably, wherein one of the inert gas and the hydrogen-containing gas supplied toward the substrate together with the source gas through the nozzle is supplied into a source gas supply pipe from a supply pipe connected to the source gas supply pipe, the source gas supply pipe being connected to the nozzle and configured to supply the source gas into the nozzle.

Preferably, in forming the nitride film, a temperature of the substrate ranges from 350° C. to 950° C.

Preferably, in forming the nitride film, a temperature of the substrate ranges from 700° C. to 950° C.

Preferably, in forming the nitride film, a temperature of the substrate ranges from 750° C. to 950° C.

Preferably, in forming the nitride film, a temperature of the substrate ranges from 800° C. to 950° C.

According to another aspect of the present invention, there is provided a method of manufacturing a semiconductor device, including:

forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;

changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of the inert gas and a hydrogen-containing gas is supplied together with the source gas through the nozzle toward the substrate such that the source gas is more strongly injected parallel to a surface of the substrate than the inert gas being injected parallel to the surface of the substrate in purging the inside of the process vessel.

According to still another aspect of the present invention, there is provided a method of manufacturing a semiconductor device, including:

forming a silicon-containing layer on a substrate by supplying a source gas containing silicon into a process vessel accommodating the substrate and exhausting the source gas from the process vessel under conditions where a chemical vapor deposition (CVD) reaction is caused;

changing the silicon-containing layer into a silicon nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately performing forming the silicon-containing layer and changing the silicon-containing layer into the silicon nitride layer; and purging the inside of the process vessel by supplying an inert gas into the process vessel and exhausting the inert gas from the process vessel between forming the silicon-containing layer on the substrate and changing the silicon-containing layer into the silicon nitride layer, wherein, in forming the silicon-containing layer, the source gas is supplied toward the substrate through a nozzle disposed at a side of the substrate, and one of the inert gas and a hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in purging the inside of the process vessel.

According to yet another aspect of the present invention, there is provided a method of manufacturing a semiconductor device, including:

forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;

changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the silicon-containing layer, the source gas is supplied toward the substrate through a nozzle disposed at a side of the substrate, and one of the inert gas and a hydrogen-containing gas is supplied together with the source gas through the nozzle toward the substrate such that the source gas is more strongly injected parallel to a surface of the substrate than the inert gas being injected parallel to the surface of the substrate in purging the inside of the process vessel.

According to yet another embodiment of the present invention, there is provided a method of processing a substrate, including:

forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;

changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

According to yet another aspect of the present invention, there is provided a method of processing a substrate, including:

forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;

changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;

forming a nitride film having a predetermined film thickness on the substrate by alternately repeating forming the layer containing the predetermined element and changing the layer containing the predetermined element into the nitride layer; and purging the inside of the process vessel by supplying an inert gas into the process vessel and exhausting the inert gas from the process vessel between forming the layer containing the predetermined element and changing the layer containing the predetermined element into the nitride layer, wherein, in forming the layer containing the predetermined element, the source gas is supplied toward the substrate through a nozzle disposed at a side of the substrate, and one of the inert gas and a hydrogen-containing gas is supplied together with the source gas through the nozzle toward the substrate such that the source gas is more strongly injected parallel to a surface of the substrate than the inert gas being injected parallel to the surface of the substrate in purging the inside of the process vessel.

According to yet another aspect of the present invention, there is provided a substrate processing apparatus including:

a process vessel configured to accommodate a substrate;

a heater configured to heat an inside of the process vessel;

a source gas supply system configured to supply a source gas containing a predetermined element into the process vessel;

a nitrogen-containing gas supply system configured to supply a nitrogen-containing gas into the process vessel;

a gas supply system configured to supply one of an inert gas and a hydrogen-containing gas into the process vessel;

an exhaust system configured to exhaust the inside of the process vessel;

a pressure regulator configured to control pressure of the inside of the process vessel; and a controller configured to control the heater, the source gas supply system, the nitrogen-containing gas supply system, the gas supply system, the exhaust system, and the pressure regulator so as to perform:

a process of forming a layer containing the predetermined element on the substrate by supplying the source gas into the process vessel accommodating the substrate and exhausting the source gas from the process vessel under a condition where a chemical vapor deposition (CVD) reaction is caused;

a process of changing the layer containing the predetermined element into a nitride layer by supplying the nitrogen-containing gas into the process vessel and exhausting the nitrogen-containing gas from the process vessel, wherein the inside of the process vessel is heated and a pressure of the inside of the process vessel is lower than an atmospheric pressure;

a process of forming a nitride film having a predetermined film thickness on the substrate by alternately repeating the process of forming the layer containing the predetermined element and the process of changing the layer containing the predetermined element into the nitride layer; and a process of purging the inside of the process vessel by supplying the inert gas into the process vessel and exhausting the inert gas from the process vessel between the process of forming the layer containing the predetermined element and the process of changing the layer containing the predetermined element into the nitride layer, wherein, in the process of forming the layer containing the predetermined element, the source gas is supplied toward the substrate through a nozzle disposed at a side of the substrate, and one of the inert gas and the hydrogen-containing gas is supplied together with the source gas through the nozzle toward the substrate, such that a flow velocity of the source gas flowing parallel to a surface of the substrate is greater than that of the inert gas flowing parallel to the surface of the substrate in purging the inside of the process vessel.

According to yet another aspect of the present invention, there is provided a substrate processing apparatus including:

a process vessel configured to accommodate a substrate;

a heater configured to heat an inside of the process vessel;

a source gas supply system configured to supply a source gas containing a predetermined element into the process vessel;

a nitrogen-containing gas supply system configured to supply a nitrogen-containing gas into the process vessel;

a gas supply system configured to supply one of an inert gas and a hydrogen-containing gas into the process vessel;

an exhaust system configured to exhaust the inside of the process vessel;

a pressure regulator configured to control pressure of the inside of the process vessel; and a controller configured to control the heater, the source gas supply system, the nitrogen-containing gas supply system, the gas supply system, the exhaust system, and the pressure regulator so as to perform:

a process of forming a layer containing the predetermined element on the substrate by supplying the source gas into the process vessel accommodating the substrate and exhausting the source gas from the process vessel under a condition where a chemical vapor deposition (CVD) reaction is caused;

a process of changing the layer containing the predetermined element into a nitride layer by supplying the nitrogen-containing gas into the process vessel and exhausting the nitrogen-containing gas from the process vessel, wherein the inside of the process vessel is heated and a pressure of the inside of the process vessel is lower than an atmospheric pressure;

a process of forming a nitride film having a predetermined film thickness on the substrate by alternately repeating the process of forming the layer containing the predetermined element and the process of changing the layer containing the predetermined element into the nitride layer; and a process of purging the inside of the process vessel by supplying the inert gas into the process vessel and exhausting the inert gas from the process vessel between the process of forming the layer containing the predetermined element and the process of changing the layer containing the predetermined element into the nitride layer, wherein, in the process of forming the layer containing the predetermined element, the source gas is supplied toward the substrate through a nozzle disposed at a side of the substrate, and one of the inert gas and the hydrogen-containing gas together is supplied with the source gas through the nozzle toward the substrate such that the source gas is more strongly injected parallel to a surface of the substrate than the inert gas being injected parallel to the surface of the substrate in the process of purging the inside of the process vessel.

Preferably, a source gas supply pipe configured to supply the source gas into the nozzle is connected to the nozzle, and a supply pipe configured to supply one of the inert gas and the hydrogen-containing gas supplied toward the substrate together with the source gas through the nozzle into the source gas supply pipe is connected to the source gas supply pipe.

What is claimed is:

1. A method of manufacturing a semiconductor device, comprising:
    forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;
    changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;
    forming a nitride film having a predetermined film thickness on the substrate by alternately repeating forming the layer containing the predetermined element and changing the layer containing the predetermined element into the nitride layer; and
    purging the inside of the process vessel by supplying an inert gas into the process vessel and exhausting the inert gas from the process vessel between forming the layer containing the predetermined element and changing the layer containing the predetermined element into the nitride layer,
    wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

2. The method of claim 1, wherein, in forming the layer containing the predetermined element, a flow rate of one of the inert gas and the hydrogen-containing gas supplied together with the source gas through the nozzle is greater than that of the inert gas supplied through the nozzle in purging the inside of the process vessel.

3. The method of claim 1, wherein, in forming the layer containing the predetermined element, a flow rate of one of the inert gas and the hydrogen-containing gas supplied together with the source gas through the nozzle is greater than that of the source gas.

4. The method of claim 1, wherein, in forming the layer containing the predetermined element, a flow rate of one of the inert gas and the hydrogen-containing gas supplied together with the source gas through the nozzle is ten to thirty times greater than that of the source gas.

5. The method of claim 1, wherein the flow rate is a volumetric flow rate.

6. The method of claim 1, wherein, in forming the layer containing the predetermined element, the layer containing the predetermined element is formed while suppressing at least one of a deposition and an adsorption of the layer containing the predetermined element by an action of one of the inert gas and the hydrogen-containing gas supplied together with the source gas through the nozzle.

7. The method of claim 1, wherein one of the inert gas and the hydrogen-containing gas supplied toward the substrate together with the source gas through the nozzle is supplied into a source gas supply pipe from a supply pipe connected to the source gas supply pipe, the source gas supply pipe being connected to the nozzle and configured to supply the source gas into the nozzle.

8. The method of claim 1, wherein, in forming the nitride film, a temperature of the substrate ranges from 350° C. to 950° C.

9. The method of claim 1, wherein, in forming the nitride film, a temperature of the substrate ranges from 700° C. to 950° C.

10. The method of claim 1, wherein, in forming the nitride film, a temperature of the substrate ranges from 750° C. to 950° C.

11. The method of claim 1, wherein, in forming the nitride film, a temperature of the substrate ranges from 800° C. to 950° C.

12. A method of processing a substrate, comprising:
    forming a layer containing a predetermined element on a substrate by supplying a source gas containing the predetermined element into a process vessel accommodating the substrate and exhausting the source gas from the process vessel under a condition where a chemical vapor deposition (CVD) reaction is caused;
    changing the layer containing the predetermined element into a nitride layer by supplying a nitrogen-containing gas into the process vessel and exhausting the nitrogen-containing gas from the process vessel, wherein an inside of the process vessel is heated and a pressure of the inside of the process vessel is lower than an atmospheric pressure;
    forming a nitride film having a predetermined film thickness on the substrate by alternately repeating forming the layer containing the predetermined element and changing the layer containing the predetermined element into the nitride layer; and
    purging the inside of the process vessel by supplying an inert gas into the process vessel and exhausting the inert gas from the process vessel between forming the layer containing the predetermined element and changing the layer containing the predetermined element into the nitride layer,
    wherein, in forming the layer containing the predetermined element, the source gas is supplied toward the substrate through a nozzle disposed at a side of the substrate, and one of an inert gas and a hydrogen-containing gas is supplied together with the source gas through the nozzle toward the substrate such that a flow velocity of the source gas flowing parallel to a surface of the substrate is greater than that of the inert gas flowing parallel to the surface of the substrate in purging the inside of the process vessel.

* * * * *